(12) United States Patent
Sanuki et al.

(10) Patent No.: US 12,142,324 B2
(45) Date of Patent: Nov. 12, 2024

(54) SEMICONDUCTOR STORAGE DEVICE AND SYSTEM

(71) Applicant: KIOXIA CORPORATION, Tokyo (JP)

(72) Inventors: Tomoya Sanuki, Yokkaichi Mie (JP); Keisuke Nakatsuka, Kobe Hyogo (JP); Daisuke Fujiwara, Yokohama Kanagawa (JP); Toshio Fujisawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 296 days.

(21) Appl. No.: 17/681,547

(22) Filed: Feb. 25, 2022

(65) Prior Publication Data

US 2023/0017909 A1    Jan. 19, 2023

(30) Foreign Application Priority Data

Jul. 19, 2021 (JP) .................... 2021-118962

(51) Int. Cl.
*G11C 16/08* (2006.01)
*G11C 8/12* (2006.01)
(Continued)

(52) U.S. Cl.
CPC ............... *G11C 16/26* (2013.01); *G11C 8/12* (2013.01); *G11C 16/0483* (2013.01);
(Continued)

(58) Field of Classification Search
CPC ............ G11C 11/4096; G11C 11/4085; G11C 11/4093; G11C 11/4094; G11C 11/4097;
(Continued)

(56) References Cited

U.S. PATENT DOCUMENTS 11,158,384 B1 * 10/2021 Yabe .................. G11C 16/26
2010/0287329 A1    11/2010 Toelkes et al.
(Continued)

FOREIGN PATENT DOCUMENTS

JP    2016-062406 A    4/2016
JP    2022-047393 A    3/2022

OTHER PUBLICATIONS

Liu Minjian "property graph" Minjian's Blog, Oct. 11, 2015, URL: https://minjianblog.wordpress.com/tag/property-graph/, 3 pages.
(Continued)

*Primary Examiner* — Huan Hoang
*Assistant Examiner* — Justin Bryce Heisterkamp
(74) *Attorney, Agent, or Firm* — Kim & Stewart LLP

(57) ABSTRACT

A semiconductor storage device includes a memory cell array and a control circuit. The memory cell array includes a plurality of memory strings, a plurality of word lines, each of which is connected to the memory strings, and a plurality of bit lines connected to the memory strings, respectively. The plurality of bit lines are grouped into a plurality of bit line groups. The control circuit is configured to receive a read command and first address information specifying one or more of the bit line groups. The control circuit is configured to, in response to the read command, read data selectively from each memory string connected to each bit line in the one or more bit line groups specified by the first address information, and output the read data.

19 Claims, 22 Drawing Sheets

(51) Int. Cl.
*G11C 16/04* (2006.01)
*G11C 16/10* (2006.01)
*G11C 16/24* (2006.01)
*G11C 16/26* (2006.01)
*G11C 16/34* (2006.01)

(52) U.S. Cl.
CPC .............. *G11C 16/08* (2013.01); *G11C 16/10* (2013.01); *G11C 16/24* (2013.01); *G11C 16/3459* (2013.01); *G11C 2213/00* (2013.01)

(58) Field of Classification Search
CPC ........ G11C 2211/5621; G11C 11/5628; G11C 11/5642; G11C 16/08; G11C 16/10; G11C 16/24; G11C 16/26; G11C 16/3459; G11C 16/0483; H10B 43/27
See application file for complete search history.

(56) References Cited

U.S. PATENT DOCUMENTS

| | | | |
|---|---|---|---|
| 2011/0216603 A1* | 9/2011 | Han | G11C 16/08 365/185.23 |
| 2015/0262712 A1* | 9/2015 | Chen | H03M 13/1108 714/723 |
| 2017/0206033 A1 | 7/2017 | Ma et al. | |
| 2018/0211705 A1* | 7/2018 | Shim | G11C 16/08 |
| 2019/0066776 A1* | 2/2019 | Tamiya | G11C 11/5628 |
| 2019/0213177 A1 | 7/2019 | Shilane et al. | |
| 2022/0083261 A1 | 3/2022 | Fujiwara et al. | |

OTHER PUBLICATIONS

"Memory System, Semiconductor Storage Device, and Method for Reading out Data" Cross-Reference to Related Applications, based upon and claims the benefit of priority from the prior Japanese Patent Application No. 2020-153283 filed in Japan on Sep. 11, 2020, 69 pages.

"DBMS popularity broken down by database model" DB-Engines, solid IT gmbh, 2021, URL: https://db-engines.com/en/ranking_categories, 4 pages.

Lee, J., et al., "ExtraV: Boosting Graph Processing Near Storage with a Coherent Accelerator" IBM Research, TU Delft, VLDB Endowment, vol. 10, No. 12, 2017, pp. 1706-1717.

Roy, A., et al., "X-Stream: Edge-centric Graph Processing using Streaming Partitions" EPFL, 24th ACM Symposium on Operating Systems Principles (SOSP) 2013, Farmington, PA, USA, Nov. 3-6, 2013, URL: http://dx.doiorg/10.1145/2517349.2522740, pp. 472-488.

Zheng, D., et al., "FlashGraph: Processing Billion-Node Graphs on an Array of Commodity SSDs", 13th USENIX Conference on File and Storage Technologies (FAST '15), Feb. 16-19, 2015, Santa Clara, CA, USA, URL: https://www.usenix.org/conference/fast15/technical-sessions/presentation/zheng, 15 pages.

Liu, H., et al., "Graphene: Fine-Grained IO Management for Graph Computing", 15th USENIX Conference on File and Storage Technologies (FAST '17), Feb. 27-Mar. 2, 2017, Santa Clara, CA, USA, URL: https://www.usenix.org/conference/fast17/technical-sessions/presentation/liu, 17 pages.

Zhu, X., et al., "GridGraph: Large-Scale Graph Processing on a Single Machine Using 2-Level Hierarchical Partitioning", 2015 USENIX Annual Technical Conference (USENIX ATC '15), Jul. 8-10, 2015, Santa Clara, CA, USA, URL: https://www.usenix.org/conference/atc15/technical-session/presentation/zhu, 13 pages.

Jun, S., et al., "GraFBoost: Using accelerated flash storage for external graph analytics" Department of Electrical Engineering and Computer Science Massachusetts Institute of Technology, 2018 ACM IEEE 45th Annual International Symposium on Computer Architecture (ISCA), 2018, 14 pages.

Zhang, M., et al., "GraphP: Reducing Communication for PIM-based Graph Processing with Efficient Data Partition", Sangfor Technologies Inc., 2018 IEEE International Symposium on High Performance Computer Architecture (HPCA), 2018, 14 pages.

Kyrola, A., et al., "GraphChi: Large-Scale Graph Computation on Just a PC", 10th USENIX Symposium on Operating Systems Design and Implementation (OSDI '12), 2012, pp. 31-46.

Maass, S., et al., "MOSAIC: Processing a Trillion-Edge Graph on a Single Machine" Georgia Institute of Technology, EuroSys '17, Apr. 23-26, 2017, Belgrade, Serbia, 2017, DOI: http://dx.doi.org/10.1145/3064176.3064191, 17 pages.

Nilakant, K., et al., "PrefEdge: SSD Prefetcher for Large-Scale Graph Traversal", SYSTOR, Jun. 10, 2014, Haifa, Israel, 2014, 12 pages.

Elyasi, N., et al., "Large-Scale Graph Processing on Emerging Storage Devices" Samsung Semiconductor Inc., 17th USENIX Conference on File and Storage Technologies (FAST '19), Feb. 25-28, 2019 • Boston, MA, USA, 2019, URL: https://www.usenix.org/conference/fast19/presentation/elyasi, 9 pages.

* cited by examiner

FIG. 8

|      | BLG0 | BLG1 | BLG2 | BLG3 | BLG4 | BLG5 | BLG6 | ... | BLG29 | BLG30 | BLG31 |
|------|------|------|------|------|------|------|------|-----|-------|-------|-------|
| GCT0 | 1 | 0 | 0 | 0 | 0 | 0 | 0 |  | 0 | 0 | 0 |
| GCT1 | 0 | 1 | 0 | 0 | 0 | 0 | 0 |  | 0 | 0 | 0 |
| GCT2 | 0 | 0 | 1 | 0 | 0 | 0 | 0 |  | 0 | 0 | 0 |
| GCT3 | 0 | 0 | 0 | 1 | 0 | 0 | 0 |  | 0 | 0 | 0 |
| GCT4 | 0 | 0 | 0 | 0 | 1 | 0 | 0 |  | 0 | 0 | 0 |
| GCT5 | 0 | 0 | 0 | 0 | 0 | 1 | 0 |  | 0 | 0 | 0 |
| GCT6 | 0 | 0 | 0 | 0 | 0 | 0 | 1 |  | 0 | 0 | 0 |
| GCT7 | 0 | 0 | 0 | 0 | 0 | 0 | 0 |  |  |  |  |
| ... |  |  |  |  |  |  |  |  |  |  |  |
| GCT28 | 0 | 0 | 0 | 0 | 0 | 0 | 0 |  | 0 | 0 | 0 |
| GCT29 | 0 | 0 | 0 | 0 | 0 | 0 | 0 |  | 1 | 0 | 0 |
| GCT30 | 0 | 0 | 0 | 0 | 0 | 0 | 0 |  | 0 | 1 | 0 |
| GCT31 | 0 | 0 | 0 | 0 | 0 | 0 | 0 |  | 0 | 0 | 1 |

FIG. 9

| NUMBER OF GWLS | NUMBER OF TO-BE-SELECTED GWLS | MAXIMUM NUMBER OF BLGS |
|---|---|---|
| 2 | 1 | 2 |
| 3 | 1 | 3 |
| 4 | 1 | 4 |
| 5 | 1 | 5 |
| 6 | 1 | 6 |
| 7 | 1 | 7 |
| 8 | 1 | 8 |
| 9 | 1 | 9 |
| 10 | 1 | 10 |
| ... | ... | ... |
| 16 | 1 | 16 |
| ... | ... | ... |
| 32 | 1 | 32 |

FIG. 15

| LOGICAL ADDRESS (UNITS OF PAGE) | PHYSICAL ADDRESS |
|---|---|
| 32'h0000_0000 | 32'h1234_5678 |
| 32'h0000_0001 | 32'h9ABC_EDF0 |
| 32'h0000_0002 | 32'h1357_9ACE |
| ... | ... |
| 32'hFFFF_FFFF | 32'h2468_ACDF |

FIG. 22

| | BLG0 | BLG1 | BLG2 | BLG3 | BLG4 | BLG5 | BLG6 | BLG7 | BLG8 | BLG9 | BLG10 | BLG11 | BLG12 | BLG13 | BLG14 |
|---|---|---|---|---|---|---|---|---|---|---|---|---|---|---|---|
| GCT0 | 1 | 1 | 1 | 1 | 1 | 1 | 1 | 1 | 1 | 1 | 1 | 1 | 1 | 1 | 1 |
| GCT1 | 1 | 1 | 0 | 1 | 1 | 0 | 1 | 0 | 0 | 0 | 0 | 0 | 0 | 0 | 0 |
| GCT2 | 1 | 0 | 0 | 1 | 0 | 1 | 0 | 1 | 1 | 1 | 0 | 0 | 0 | 0 | 0 |
| GCT3 | 0 | 1 | 0 | 0 | 0 | 1 | 0 | 0 | 0 | 1 | 0 | 1 | 0 | 1 | 0 |
| GCT4 | 0 | 0 | 1 | 0 | 0 | 0 | 1 | 0 | 0 | 1 | 1 | 0 | 1 | 0 | 0 |
| GCT5 | 0 | 0 | 0 | 1 | 0 | 0 | 0 | 1 | 0 | 0 | 1 | 1 | 1 | 0 | 1 |
| GCT6 | 0 | 0 | 0 | 0 | 1 | 0 | 1 | 0 | 1 | 0 | 0 | 0 | 0 | 1 | 1 |

| | BLG15 | BLG16 | BLG17 | BLG18 | BLG19 | BLG20 | BLG21 | BLG22 | BLG23 | BLG24 | BLG25 | BLG26 | BLG27 | BLG28 | BLG29 | BLG30 | BLG31 | BLG32 | BLG33 | BLG34 |
|---|---|---|---|---|---|---|---|---|---|---|---|---|---|---|---|---|---|---|---|---|
| GCT0 | 0 | 0 | 0 | 0 | 0 | 0 | 0 | 0 | 0 | 0 | 0 | 0 | 0 | 0 | 0 | 0 | 0 | 0 | 0 | 0 |
| GCT1 | 1 | 1 | 1 | 1 | 1 | 1 | 1 | 1 | 1 | 1 | 1 | 1 | 1 | 1 | 1 | 1 | 1 | 1 | 1 | 1 |
| GCT2 | 1 | 1 | 1 | 1 | 0 | 0 | 0 | 0 | 0 | 0 | 1 | 1 | 1 | 1 | 1 | 1 | 1 | 1 | 1 | 1 |
| GCT3 | 1 | 0 | 0 | 0 | 1 | 1 | 1 | 0 | 0 | 0 | 1 | 0 | 0 | 1 | 1 | 0 | 1 | 1 | 0 | 0 |
| GCT4 | 0 | 1 | 0 | 0 | 1 | 0 | 0 | 1 | 1 | 0 | 0 | 1 | 0 | 1 | 0 | 1 | 1 | 0 | 1 | 1 |
| GCT5 | 0 | 0 | 1 | 0 | 0 | 1 | 0 | 1 | 0 | 1 | 0 | 0 | 1 | 0 | 1 | 1 | 0 | 1 | 1 | 0 |
| GCT6 | 0 | 0 | 0 | 1 | 0 | 0 | 1 | 0 | 1 | 1 | 0 | 1 | 1 | 0 | 1 | 0 | 1 | 1 | 1 | 1 |

FIG. 23

| NUMBER OF GWLS | NUMBER OF TO-BE-SELECTED GWLS (MAXIMIZING NUMBER OF BLGS) | MAXIMUM NUMBER OF BLGS |
|---|---|---|
| 2 | 1 | 2 |
| 3 | 1 | 3 |
| 4 | 2 | 6 |
| 5 | 2 | 10 |
| 6 | 3 | 20 |
| 7 | 3 | 35 |
| 8 | 4 | 70 |
| 9 | 4 | 126 |
| 10 | 5 | 252 |
| ... | ... | ... |
| 2t | t | $_{2t}C_t$ |
| 2t+1 | t | $_{2t+1}C_t$ |

SEMICONDUCTOR STORAGE DEVICE AND SYSTEM

CROSS-REFERENCE TO RELATED APPLICATION

This application is based upon and claims the benefit of priority from Japanese Patent Application No. 2021-118962, filed Jul. 19, 2021, the entire contents of which are incorporated herein by reference.

FIELD

Embodiments described herein relate generally to a semiconductor storage device and a system.

BACKGROUND

NAND flash memory is known as a semiconductor storage device.

BRIEF DESCRIPTION OF THE DRAWINGS

FIG. 8 is a table listing the setting of the threshold voltage of each group-selection transistor GCT in the string unit.

FIG. 9 is a table listing how many bit line groups may be configured according to the number of group-selection word lines related to a certain block of the memory cell array of the semiconductor storage device according to the first embodiment.

FIG. 15 is a diagram illustrating an example of a table used by the memory controller according to the first embodiment when generating a command set for causing the semiconductor storage device to execute the read operation.

FIG. 22 is a diagram illustrating a table listing an example of setting a threshold voltage of each group-selection transistor in a certain string unit of the semiconductor storage device according to the second embodiment.

FIG. 23 is a diagram illustrating a table listing how many bit line groups may be configured according to the number of group-selection word lines related to a certain block of the memory cell array of the semiconductor storage device according to the second embodiment.

DETAILED DESCRIPTION

Figure 1:
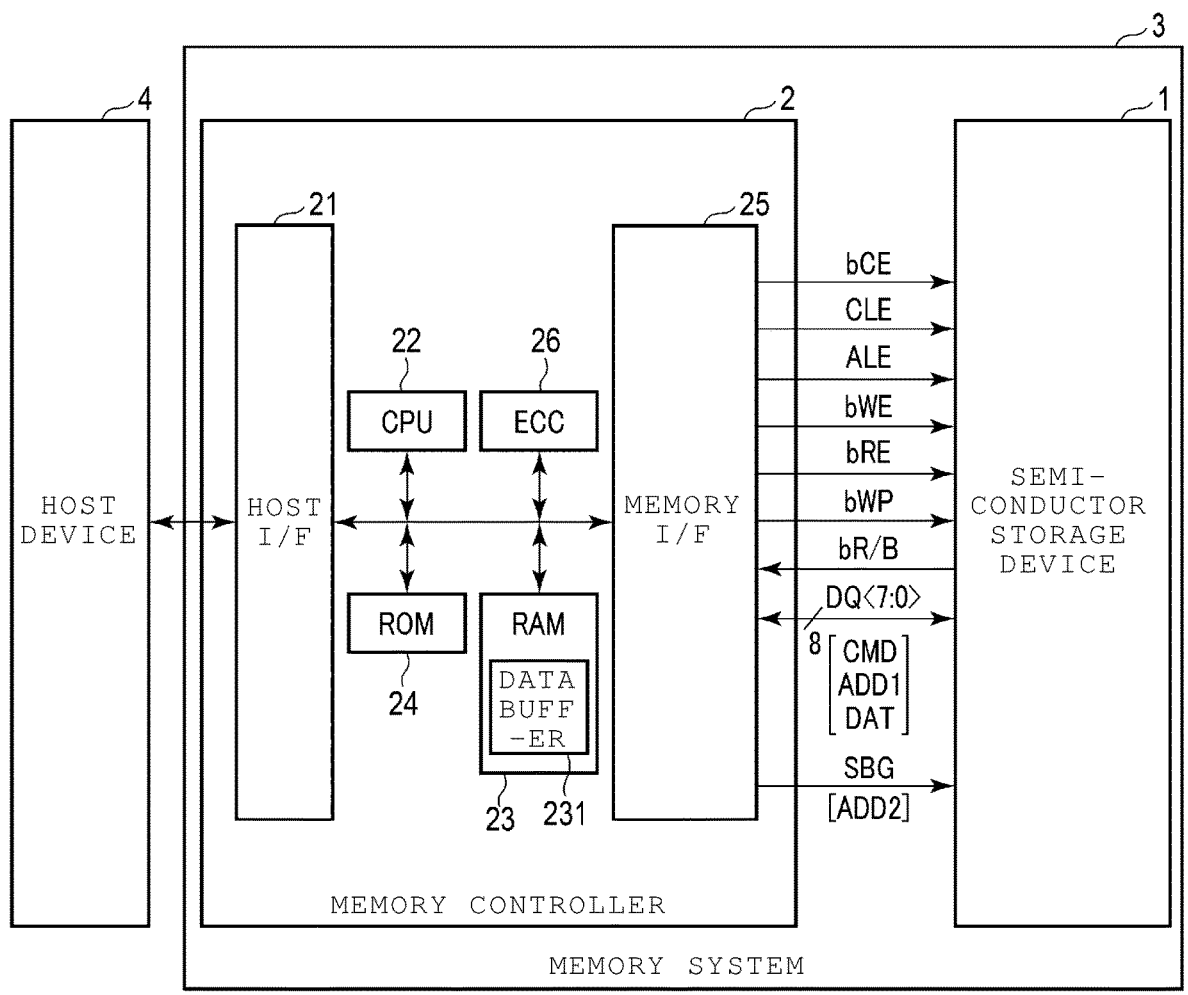
FIG. 1 is a block diagram illustrating an example of a configuration of a memory system including a semiconductor storage device according to a first embodiment.

Provided is a semiconductor storage device capable of performing a high-speed operation.

In general, according to an embodiment, a semiconductor storage device includes a memory cell array and a control circuit. The memory cell array includes a plurality of memory strings, a plurality of word lines, each of which is connected to the memory strings, and a plurality of bit lines connected to the memory strings, respectively. The plurality of bit lines are grouped into a plurality of bit line groups. The control circuit is configured to receive a read command and first address information specifying one or more of the bit line groups. The control circuit is configured to, in response to the read command, read data selectively from each memory string connected to each bit line in the one or more bit line groups specified by the first address information, and output the read data.

Hereinafter, embodiments will be described with reference to the drawings. In the following description, components having the same function and configuration are denoted by a common reference numeral. When distinguishing a plurality of components having a common reference numeral, subscripts are attached to the common reference numeral to distinguish the plurality of components. When it is not necessary to distinguish a plurality of components, the plurality of components are noted by only a common reference numeral, and no subscript is added.

Each functional block may be implemented with any one of hardware and software or both of hardware and software. In addition, it is not necessary that each functional block be distinguished as described below. For example, some functions may be executed by a functional block different from the illustrated functional block. Furthermore, the illustrated functional block may be divided into finer functional sub-blocks. In addition, the names of each functional block and each component in the following description are for the convenience, and do not limit the configuration and operation of each functional block and each component.

First Embodiment

Hereinafter, a semiconductor storage device 1 according to a first embodiment will be described.

CONFIGURATION EXAMPLE (1) Memory System

FIG. 1 is a block diagram illustrating an example of a configuration of a memory system 3 including the semiconductor storage device 1 according to the first embodiment.

The memory system 3 includes the semiconductor storage device 1 and a memory controller 2 and is controlled by a host device 4. The memory system 3 is, for example, a memory card such as an SD™ card, an SSD (Solid State Drive), or the like.

The semiconductor storage device 1 is controlled by the memory controller 2. The memory controller 2 receives a host command from the host device 4 and controls the semiconductor storage device 1 based on the host command. By the control, various operations such as an operation (hereinafter, referred to as a write operation) of storing write data in the memory cell array of the semiconductor storage device 1 and an operation (hereinafter, referred to as a read operation) of reading read data from the memory cell array of the semiconductor storage device 1 are executed.

The memory controller 2 includes a host interface circuit 21, a CPU (Central Processing Unit)_22, a RAM (Random Access Memory)_23, a ROM (Read Only Memory)_24, a memory interface circuit 25, and an Error Check and Correction (ECC) circuit 26. The memory controller 2 is configured as, for example, a System-on-a-Chip (SoC).

The host interface circuit 21 is connected to the host device 4 via a host interface and controls communication between the memory controller 2 and the host device 4. For example, the host interface circuit 21 receives the host command transmitted from the host device 4 to the memory controller 2.

The ROM 24 stores firmware (program). The RAM 23 can store the firmware and is used as a work area of the CPU 22. The firmware stored in the ROM 24 and loaded onto the RAM 23 is executed by the CPU 22. Accordingly, the memory controller 2 can execute various operations including the write operation and the read operation and can perform a portion of functions of the host interface circuit 21 and the memory interface circuit 25.

Furthermore, for example, the RAM 23 temporarily stores data and functions as a buffer and cache. A portion of the RAM 23 functioning as the buffer will be described as a data buffer 231. The data buffer 231 receives the write data transmitted from the host device 4 via the host interface circuit 21 and temporarily stores the write data. The data buffer 231 also temporarily stores read data transmitted to the host device 4 via the host interface circuit 21. The data buffer 231 may be a volatile memory or a non-volatile memory.

The memory interface circuit 25 is connected to the semiconductor storage device 1 via a memory interface and controls communication between the memory controller 2 and the semiconductor storage device 1. The memory interface transfers, for example, a chip enable signal bCE, a command latch enable signal CLE, an address latch enable signal ALE, a write enable signal bWE, a read enable signal bRE, a write protect signal bWP, a ready/busy signal bR/B, and signals DQ<0> to DQ<7>. Hereinafter, the signals DQ<0> to DQ<7> are referred to as signals DQ<7:0>. The memory interface may also transfer the signal SBG. The signal SBG is transferred via, for example, a signal line different from a signal line used for transferring the signals DQ<7:0>. The signal SBG is, for example, received by the semiconductor storage device 1 via an external terminal different from the external terminal used by the semiconductor storage device 1 for receiving the signals DQ<7:0>.

The memory interface circuit 25 generates, for example, a command set based on the host command from the host device 4 and transmits the command set to the semiconductor storage device 1 via the signals DQ<7:0>. The command set includes, for example, a command CMD and address information ADD1. The command set may include write data DAT in addition to the command CMD and the address information ADD1. The memory interface circuit 25 may generate address information ADD2 based on the host command and transmits the address information ADD2 to the semiconductor storage device 1 via the signal SBG. The address information ADD2 is, for example, address information used together with the address information ADD1 in a certain read operation. On the other hand, the memory interface circuit 25 receives read data DAT transmitted from the semiconductor storage device 1 via the signals DQ<7:0>. In this specification, in order to facilitate reference, both the write data and the read data transmitted and received by the memory interface circuit 25 are described with the reference numeral DAT denoted in this manner. Hereinafter, the write data and the read data are also collectively referred to as data DAT.

The ECC circuit 26 receives the write data stored in the data buffer 231. The ECC circuit 26 attaches an error correction code to the write data. The write data to which the error correction code is attached is the write data DAT. The ECC circuit 26 supplies the write data DAT to, for example, the data buffer 231 or the memory interface circuit 25.

The ECC circuit 26 receives the read data DAT transmitted from the semiconductor storage device 1 via the memory interface circuit 25. The ECC circuit 26 determines whether an error exists in the read data DAT based on the error correction code. When the ECC circuit 26 determines that an error exists in the read data DAT, the ECC circuit 26 performs an error correction process on the read data DAT based on the error correction code. The ECC circuit 26 supplies the read data after the error correction process to, for example, the data buffer 231 or the like.

(2) Semiconductor Storage Device

Figure 2:
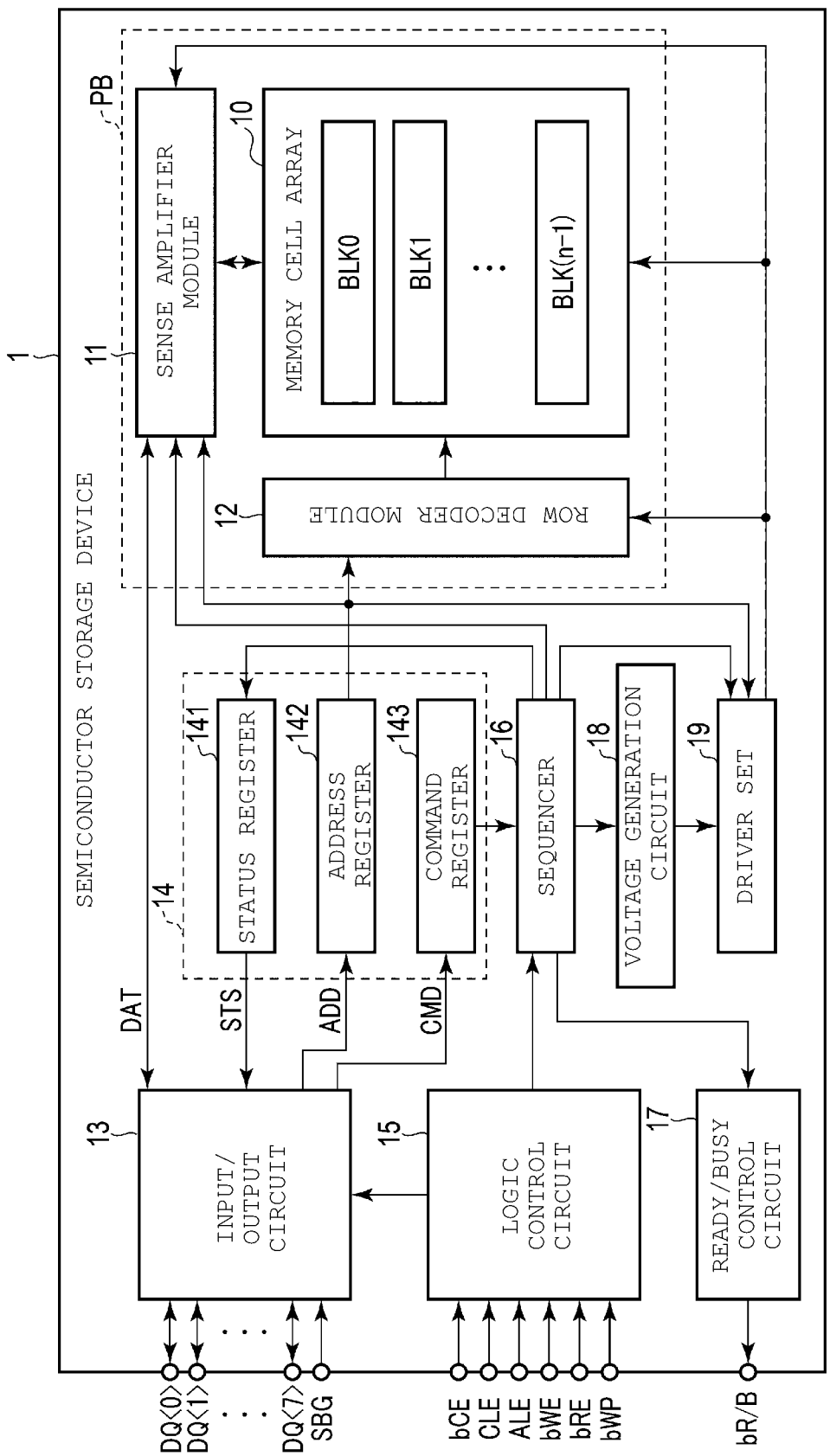
FIG. 2 is a block diagram illustrating an example of a configuration of the semiconductor storage device according to the first embodiment.

FIG. 2 is a block diagram illustrating an example of a configuration of the semiconductor storage device 1 according to the first embodiment. The semiconductor storage device 1 according to the first embodiment is, for example, a NAND flash memory capable of storing data in a nonvolatile manner.

The semiconductor storage device 1 includes a memory cell array 10, a sense amplifier module 11, a row decoder module 12, an input/output circuit 13, a register 14, a logic control circuit 15, a sequencer 16, a ready/busy control circuit 17, a voltage generation circuit 18, and a driver set 19.

The memory cell array 10 includes blocks BLK0 to BLK(n−1) (n is an integer of 1 or more). Each block BLK includes a plurality of non-volatile memory cells associated with bit lines and word lines and is, for example, a unit of data erasing. For example, a Single-Level Cell (SLC) method, a Multi-Level Cell (MLC) method, a Triple-Level Cell (TLC) method, or a Quad-Level Cell (QLC) method may be applied in the semiconductor storage device 1. In the SLC mode, 1-bit data is stored in each memory cell, in the MLC mode, 2-bit data is stored in each memory cell, in the TLC mode, 3-bit data is stored in each memory cell, and in the QLC mode, 4-bit data is stored in each memory cell. It is noted that data of 5 bits or more may be stored in each memory cell.

The input/output circuit 13 controls input/output of the signals DQ<7:0> to/from the memory controller 2. The signals DQ<7:0> include, for example, the command CMD, the data DAT, the address information ADD1, and status information STS. The command CMD includes, for example, a command for causing the semiconductor storage device 1 to execute a process according to the host command from the host device 4. The address information ADD1 includes, for example, a column address and a row address. The row address includes, for example, a block address, a page address, a string address, and a plane address. The plane address may be provided in, for example, the block address. The status information STS includes, for example, information regarding results of the write and read operations performed in the semiconductor storage device 1.

More specifically, the input/output circuit 13 includes an input circuit and an output circuit. The input circuit and the output circuit perform the following processing. The input circuit receives the write data DAT, the address information ADD1, and the command CMD from the memory controller 2 via the signals DQ<7:0>. The input circuit transfers the write data DAT to the sense amplifier module 11 and transfers the address information ADD1 and the command CMD to the register 14. The output circuit receives the status information STS from the register 14 and receives the read data DAT from the sense amplifier module 11. The output circuit transmits the status information STS and the read data DAT to the memory controller 2 via the signals DQ<7:0>. Herein, the input/output circuit 13 and the sense amplifier module 11 are connected via a data bus. The data bus includes, for example, eight data lines IO0 to IO7 associated with signals DQ0 to DQ7, respectively. It is noted that the number of data line IOs is not limited to eight and may be, for example, 16 or 32 and may be set to be any applicable number.

The input/output circuit 13 further controls input of the signal SBG from the memory controller 2. More specifically, the input circuit receives the address information ADD2 from the memory controller 2 via the signal SBG. The input circuit transfers the address information ADD2 to the register 14.

The register 14 includes a status register 141, an address register 142, and a command register 143.

The status register 141 stores the status information STS and transfers the status information STS to the input/output circuit 13 based on an instruction of the sequencer 16.

The address register 142 stores the address information ADD1 transferred from the input/output circuit and transfers the address information ADD1 to the sequencer 16. The address register 142 transfers the column address in the address information ADD1 to the sense amplifier module 11 and transfers the row address in the address information ADD1 to the row decoder module 12. The address register 142 transfers, for example, the row address to the driver set 19.

The address register 142 further stores the address information ADD2 transferred from the input/output circuit and transfers the address information ADD2 to the sequencer 16. The address register 142 further transfers, for example, the address information ADD2 to the driver set 19 and the sense amplifier module 11.

It is noted that in this specification, when it is described that the address register 142 transfers certain address information to a certain component and the component operates based on the address information, the address register 142 may not necessarily transfer the address information directly to the component. Alternatively, for example, the sequencer 16 that has received the address information may control the operation of the component based on the address information.

The command register 143 stores the command CMD transferred from the input/output circuit 13 and transfers the command CMD to the sequencer 16.

The logic control circuit 15 receives, for example, the chip enable signal bCE, the command latch enable signal CLE, the address latch enable signal ALE, the write enable signal bWE, the read enable signal bRE, and the write protect signal bWP from the memory controller 2. The logic control circuit 15 controls the input/output circuit 13 and the sequencer 16 based on these signals.

The chip enable signal bCE is used to enable the semiconductor storage device 1. The command latch enable signal CLE is used to notify the input/output circuit 13 of the period of time during which the command CMD is transmitted via the signals DQ<7:0> input to the semiconductor storage device 1. The address latch enable signal ALE is used to notify the input/output circuit 13 of the period of time during which the address information ADD1 is transmitted via the signals DQ<7:0> input to the semiconductor storage device 1. The write enable signal bWE and the read enable signal bRE are used to enable the input and output of the signals DQ<7:0> by the input/output circuit 13, respectively. The write protect signal bWP is used to prohibit writing and erasing of data in the semiconductor storage device 1.

The sequencer 16 receives the command CMD and the address information ADD1 from the register 14 and controls the entire operations of the semiconductor storage device 1 according to the command CMD and the address information ADD1. The sequencer 16 further receives the address information ADD2 from the address register 142. The control of the entire operations of the semiconductor storage device 1 by the sequencer 16 may be also based on the address information ADD2. The sequencer 16 controls, for example, the sense amplifier module 11, the row decoder module 12, the voltage generation circuit 18, the driver set 19, and the like to execute various operations such as a write operation and a read operation.

The sequencer 16 generates the status information STS and transmits the status information STS to the status register 141.

The ready/busy control circuit 17 generates the ready/busy signal bR/B according to the control of the sequencer 16 and transmits the ready/busy signal bR/B to the memory controller 2. The ready/busy signal bR/B is used to notify the memory controller 2 whether the semiconductor storage device 1 is in a ready state or a busy state. In the ready state, the semiconductor storage device 1 receives a command from the memory controller 2. In the busy state, the semiconductor storage device 1 does not receive, for example, a command from the memory controller 2 for executing an operation involving access to the memory cell array 10.

The voltage generation circuit 18 generates various voltages based on the control of the sequencer 16 and supplies the generated voltages to the driver set 19.

The driver set 19 receives, for example, the row address from the address register 142 and decodes the row address. The driver set 19 supplies, for example, various voltages (may be referred to as "operation voltages") used in various operations among the voltage supplied from the voltage generation circuit 18 and the like to the memory cell array 10, the sense amplifier module 11, the row decoder module 12, and the like based on the result of the decoding. The driver set 19 further receives, for example, the address information ADD2 from the address register 142 and decodes the address information ADD2. The supply of the various voltages by the driver set 19 may be based on the result of the decoding of the address information ADD2.

The sense amplifier module 11 receives the column address from the address register 142 and decodes the column address. The sense amplifier module 11 executes the transfer operation of the data DAT between the memory controller 2 and the memory cell array 10 based on the result of the decoding. That is, the sense amplifier module 11 receives the write data DAT from the memory controller 2 via the input/output circuit 13 and transfers the write data DAT to the memory cell array 10. Further, the sense amplifier module 11 reads the read data DAT from the memory cell in the memory cell array 10 and outputs the read data DAT to the memory controller 2 via the input/output circuit 13. The sense amplifier module 11 further receives, for example, the address information ADD2 from the address register 142 and decodes the address information ADD2. The reading of the read data DAT and the transferring of the read data to the input/output circuit 13 by the sense amplifier module 11 may be based on the result of decoding of the address information ADD2.

The row decoder module 12 receives the row address from the address register 142 and decodes the row address. The row decoder module 12 selects a certain block BLK (hereinafter, referred to as a selected block BLK(sel)) which is a target of execution of various operations such as a read operation and a write operation among the blocks BLK of the memory cell array 10, based on the result of the decoding. The row decoder module 12 can transfer the voltages supplied from the driver set 19 to the selected block BLK(sel). The row decoder module 12 may select the plurality of blocks BLK based on the result of the decoding, and the row decoder module 12 enables the voltage transferring to each of the selected blocks BLK(sel).

The combination of the memory cell array 10, the sense amplifier module 11, and the row decoder module 12 described above is included in a plane PB. The semiconductor storage device 1 includes, for example, a plurality of the planes PB, and each plane PB has the same configuration as the plane PB described above.

(3) Memory Cell Array

Figure 3:
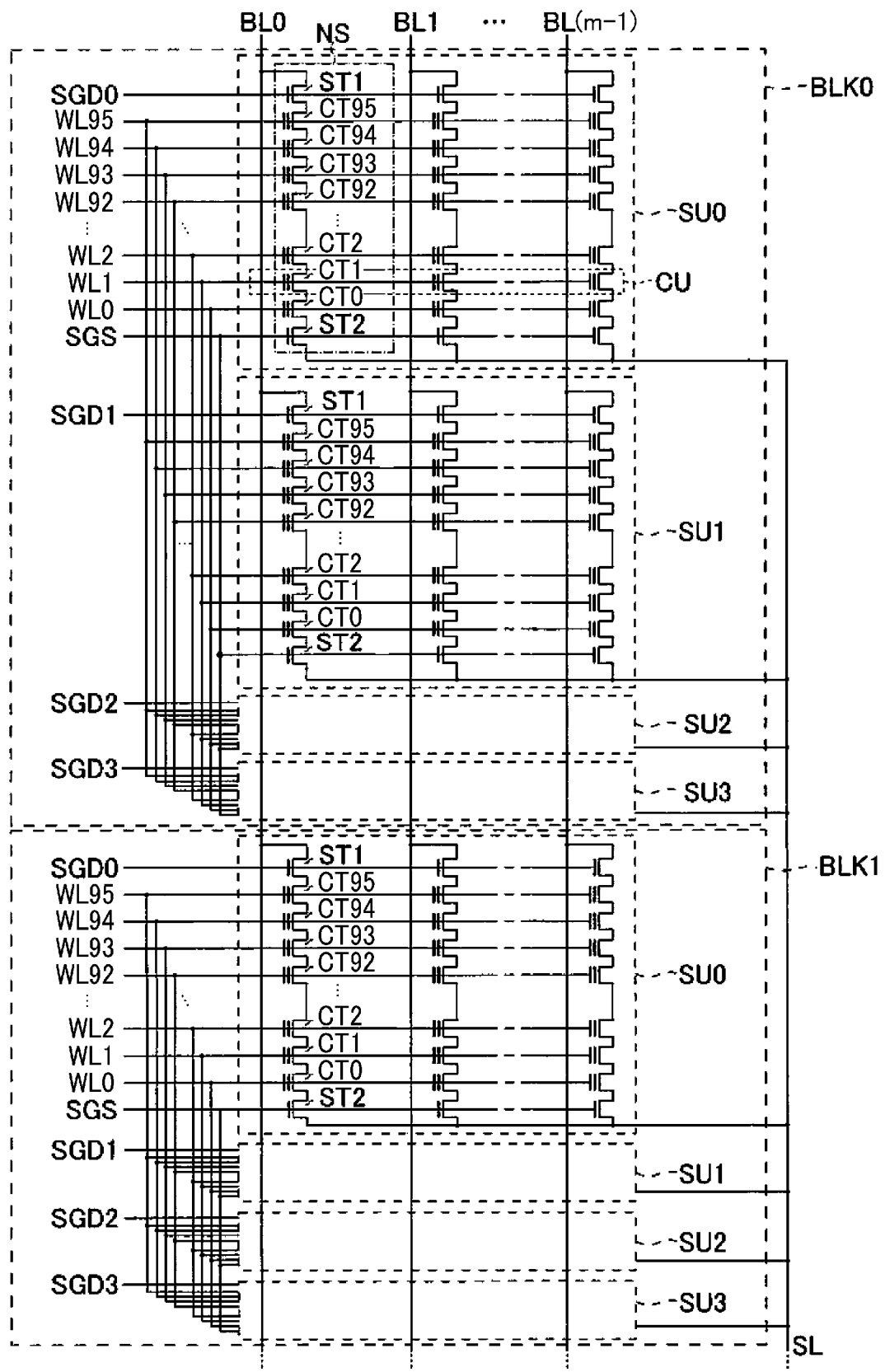
FIG. 3 is a diagram illustrating an example of a circuit configuration of a memory cell array of the semiconductor storage device according to the first embodiment.

FIG. 3 illustrates an example of a circuit configuration of the memory cell array 10 of the semiconductor storage device 1 according to the first embodiment. As an example of the circuit configuration of the memory cell array 10, illustrated is an example of the circuit configuration of the blocks BLK0 and BLK1 provided in the memory cell array 10.

Hereinafter, the description will be focused on the circuit configuration of a certain block BLK. The following description also applies to both blocks BLK0 and BLK1. The following description also applies to each of the other blocks BLK provided in the memory cell array 10.

The block BLK includes, for example, four string units SU0 to SU3. Each string unit SU includes a plurality of NAND strings (may be referred to as "memory strings") NS. The plurality of NAND strings NS are associated with m bit lines BL0, BL1, . . . , and BL(m−1) (m is an integer of 1 or more) on a one-to-one basis. Each NAND string NS is connected to the associated bit line BL and includes, for example, 96 cell transistors CT0 to CT95 and select transistors ST1 and ST2. Each cell transistor CT includes a control gate (hereinafter, also referred to as a gate) and a charge storage layer. Each cell transistor CT can store data in a non-volatile manner as a memory cell if used for that purpose. In this specification, each of the cell transistors CT functioning as a memory cell is also referred to as a memory cell transistor. Each of the select transistors ST1 and ST2 is used to select the NAND string NS including the select transistors ST1 and ST2 during various operations.

The drain of the select transistor ST1 of each NAND string NS is connected to the bit line BL associated with the NAND string NS. The cell transistors CT0 to CT95 are connected in series between the source of the select transistor ST1 and the drain of the select transistor ST2. More specifically, the source of the select transistor ST1 is connected to the drain of the cell transistor CT95, the source of the cell transistor CT95 is connected to the drain of the cell transistor CT94, the source of the cell transistor CT94 is connected to the drain of the cell transistor CT93, . . . , the source of the cell transistor CT1 is connected to the drain of the cell transistor CT0, and the source of the cell transistor CT0 is connected to the drain of the select transistor ST2. The source of the select transistor ST2 is connected to a source line SL.

The wirings connected to the gates of the select transistors ST1 and ST2 and the cell transistors CT0 to CT95 will be described by using integers j and k. In the example of FIG. 3, the following description applies to each case where j is an integer from 0 to 3 and applies to each case where k is an integer from 0 to 95.

The gate of each select transistor ST1 of the NAND string NS provided in a string unit SUj is commonly connected to a select gate line SGDj. The gate of each select transistors ST2 of the NAND string NS provided in the block BLK is commonly connected to the select gate line SGS. The gate of each cell transistors CTk of the NAND strings NS provided in the block BLK is commonly connected to a word line WLk. Select gate lines SGD and SGS and the word line WL are provided, for example, for each block. Each of the bit lines BL is connected to the drain of the select transistor ST1 of the associated NAND string NS provided in each of the string units SU of the block BLK. The bit line BL is shared among the blocks BLK, for example, by being connected in different blocks BLK of the memory cell array 10 in the same manner. Such a bit line BL is provided, for example, for each plane PB. In this case, for example, the same bit line BL is not shared among the blocks BLK of the different planes PB.

The source line SL is shared among the string units SU of the block BLK by being commonly connected to the source of each select transistor ST2 of the NAND string NS provided in the block BLK. The source line SL is shared among the blocks BLK, for example, by being connected in different blocks BLK in the same manner.

A set of cell transistors CT commonly connected to one word line WL in one string unit SU is referred to as, for example, a cell unit CU. For example, when each of the cell transistors CT in the cell unit CU functions as a memory cell, a set of 1-bit data having the same digits stored in each of the cell transistors CT is referred to as, for example, "1 page data". For example, when a plurality of bits of data are stored in each memory cell in the MLC mode or the like, a plurality of "one page data" may be stored in one cell unit CU.

Although the circuit configuration of the memory cell array 10 is described above, the circuit configuration of the memory cell array 10 is not limited to the above-described configuration. For example, the number of string units SU provided in each block BLK may be designed to be any applicable number. Each of the number of cell transistors CT and the number of select transistors ST1 and ST2 provided in each NAND string NS may be designed to be any applicable number. The number of word lines WL, the number of select gate lines SGD, and the number of select gate lines SGS are changed based on the number of cell transistors CT, the number of select transistors ST1, and the number of select transistors ST2 in the NAND string NS, respectively.

In this specification, the case where each cell transistor CT uses a charge storage layer for storing data will be described, but the configuration of each cell transistor CT is not limited thereto. For example, each cell transistor CT may store data by using a floating gate instead of the charge storage layer.

Figure 4:
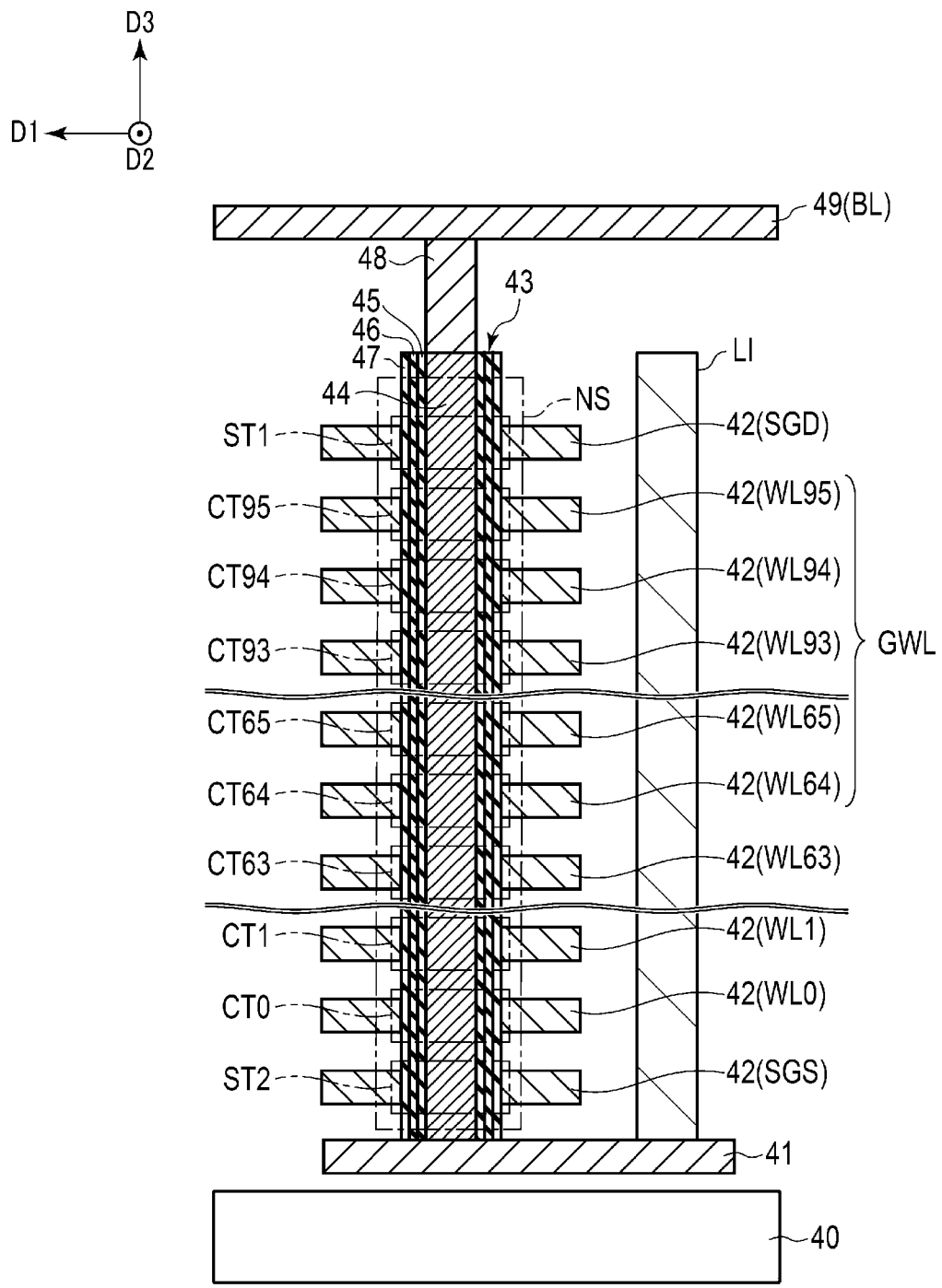
FIG. 4 is a cross-sectional diagram illustrating a portion of a cross-sectional structure of the memory cell array of the semiconductor storage device according to the first embodiment.

FIG. 4 is a cross-sectional diagram illustrating an example of a portion of a cross-sectional structure of the memory cell array 10 of the semiconductor storage device 1 according to the first embodiment. In the example of FIG. 4, an interlayer insulator is omitted. Reference numeral GWL illustrated in FIG. 4 is denoted in the subsequent description of the drawings.

A portion of the structure of the memory cell array 10 is configured with conductors 41, 42, and 49, a memory pillar 43, and a contact plug 48.

The semiconductor storage device 1 includes a semiconductor substrate 40. Herein, two directions parallel to the plane of the semiconductor substrate 40, for example, perpendicular to each other are defined as a first direction D1 and a second direction D2. The direction which intersects the surface and in which the memory cell array 10 is formed with reference to the surface is defined as a third direction D3. The third direction D3 is described as being perpendicular to the first direction D1 and the second direction D2 but is not necessarily limited thereto. Hereinafter, the description will be made with the third direction D3 as "up" and the direction opposite to the third direction D3 as "down", but this notation is merely for the convenience and is irrelevant to, for example, the direction of gravity.

The conductor 41 is provided above the semiconductor substrate 40 via an insulator. The conductor 41 functions as the source line SL. A plurality of layers of conductors 42 are sequentially stacked above the conductor 41 between the adjacent conductors via an insulator. In FIG. 4, 98 layers of conductors 42 are stacked, and the 98 layers of conductors 42 function as the select gate line SGS, a word line WL0, a word line WL1, a word line WL2, . . . , a word line WL95, and the select gate line SGD, respectively.

The memory pillar 43 is provided in the plurality of layers of the conductor 42. The memory pillar 43 extends in, for example, the D3 direction. The memory pillar 43 has a configuration in which a tunnel insulating layer 45, a charge storage layer 46, and a block insulating layer 47 are sequentially provided on the side surface of a pillar-shaped semiconductor 44. The semiconductor 44 reaches the conductor 41 at the lower end. The portion of the memory pillar 43 intersecting one conductor 42 functions as one cell transistor CT, select transistor ST1, or select transistor ST2. In FIG. 4, a portion functioning as the select transistor ST2, the cell transistor CT0, the cell transistor CT1, the cell transistor CT2, . . . , the cell transistor CT95, and the select transistor ST1 are provided in this order from the bottom to the top. The select transistor ST2, the cell transistors CT0 to CT95, and the select transistor ST1 are provided in a certain NAND string NS. The semiconductor 44 functions as a current path of the NAND string NS, and serves as a region in which a channel of each cell transistor CT is formed.

The upper end of the semiconductor 44 is connected to the conductor 49 via the contact plug 48. The conductor 49 extends in, for example, the first direction D1 and functions as a bit line BL. Further, a conductor LI is provided on the conductor 41. The conductor LI extends in, for example, the second direction D2 and the third direction D3 and functions as a source line contact. The conductor LI has, for example, a line shape along the second direction D2. For example, one string unit SU is disposed between the two conductors LI.

(4) Threshold Voltage of Memory Cell Transistor

As the voltage applied to the gate of the cell transistor CT is increased, the cell transistor CT is switched from an OFF state to an ON state. The OFF state is a state in which a channel through which a current flows through the cell transistor CT is not formed, and the ON state is a state in which the channel is formed. The voltage at which the cell transistor CT is just switched from the OFF state to the ON state in this manner is referred to as the threshold voltage of the cell transistor CT. The threshold voltage may be a negative voltage.

The description related to the threshold voltage of each cell transistor CT functioning as a memory cell will be made with reference to FIG. 5.

Figure 5:
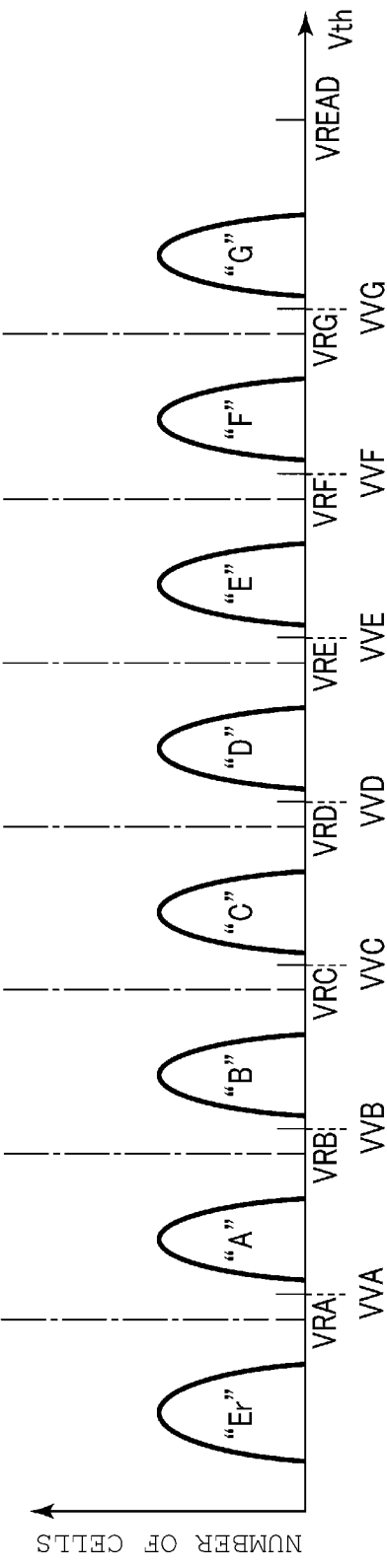
FIG. 5 is a diagram illustrating an example of a threshold voltage distribution in a memory cell transistor of the semiconductor storage device according to the first embodiment.

FIG. 5 illustrates an example of the threshold voltage distribution, the allocation of the data, the read voltage, and the verification voltage when each cell transistor CT of the memory cell array 10 illustrated in FIG. 3 stores 3-bit data in the TLC mode.

The cell transistor CT stores the above-mentioned 3-bit data based on the threshold voltage. In the write operation, a program operation is performed in which the threshold voltage of the cell transistor CT is increased by injecting electrons into the charge storage layer of the cell transistor CT.

FIG. 5 schematically illustrates, as an example of eight threshold voltage distributions formed as a result of such control of the threshold voltage, an example of a graph obtained by plotting the number of cell transistors CT such that the threshold voltage of the cell transistor CT is a certain value as a variable. The horizontal axis represents the value of the threshold voltage Vth of the cell transistor CT. The vertical axis represents the number of cell transistors CT.

The eight threshold voltage distributions are associated with, for example, an "Er" state, an "A" state, a "B" state, a "C" state, a "D" state, an "E" state, an "F" state, and a "G" state, respectively. According to the threshold voltage of the cell transistor CT, the cell transistor CT is distinguished as being in any of these states. The threshold voltage of the transistor CT is increased in the order in which the cell transistor CT is in the "Er" state, the "A" state, the "B" state, the "C" state, the "D" state, the "E" state, the "F" state, and the "G" state. For example, "111" ("upper bit/middle bit/lower bit") data is allocated to the "Er" state, "110" data is allocated to the "A" state, "100" data is allocated to the "B" state, "000" data is allocated to the "C" state, "010" data is allocated to the "D" state, "011" data is allocated to the "E" state, "001" is allocated to the "F" state, and "101" data is allocated to the "G" state. The data allocated to each state is the data stored in the cell transistor CT in that state.

In the write operation, a verification operation is performed to check whether the threshold voltage of the cell transistor CT has reached the target voltage. A verification voltage used in the verification operation is set. Specifically, a verification voltage VVA is set in association with the "A" state, a verification voltage VVB is set in association with the "B" state, a verification voltage VVC is set in association with the "C" state, a verification voltage VVD is set in association with the "D" state, a verification voltage VVE is set in association with the "E" state, a verification voltage VVF is set in association with the "F" state, and a verification voltage VVG is set in association with the "G" state.

A case where the verification voltage VVA is applied to the gate of a certain cell transistor CT will be described. When the cell transistor CT is in the ON state, it may be seen that the threshold voltage of the cell transistor CT has not reached the target voltage. On the other hand, when the cell transistor CT is in the OFF state, it may be seen that the threshold voltage of the cell transistor CT has reached the target voltage. Accordingly, for example, as a result of the write operation of data, it is possible to check whether the threshold voltage of the cell transistor CT as a write target has reached the target voltage. The same is applied to other verification voltages.

In the read operation, it is determined in which state the cell transistor CT is in. The read voltage used in the read operation is set. Specifically, a read voltage VRA is set in association with the "A" state, a read voltage VRB is set in association with the "B" state, a read voltage VRC is set in association with the "C" state, a read voltage VRD is set in association with the "D" state, a read voltage VRE is set in association with the "E" state, a read voltage VRF is set in association with the "F" state, and a read voltage VRG is set in association with the "G" state.

A case where the read voltage VRA is applied to the gate of a certain cell transistor CT will be described. When the cell transistor CT is in the ON state, it may be seen that the cell transistor CT is in the "Er" state. On the other hand, when the cell transistor CT is in the OFF state, it may be seen that the cell transistor CT is in one of the "A" state, the "B" state, the "C" state, the "D" state, the state, the state, and "G" state. Accordingly, it is possible to determine whether the cell transistor CT is in the "Er" state or which one of the "A" state, the "B" state, the "C" state, the "D" state, the "E" state, the "F" state, and the "G" state the cell transistor CT is in. The same is applied to other read voltages.

Before executing the read operation, some of electrons stored in the charge storage layer of the cell transistor CT may escape from the charge storage layer with passage of time, and thus, the threshold voltage of the cell transistor CT may decrease over time. In order to cope with such a decrease in the threshold voltage, each read voltage is set to be lower than the verification voltage set in association with the same state as the read voltage. That is, the read voltage VRA is lower than the verification voltage VVA, the read voltage VRB is lower than the verification voltage VVB, the read voltage VRC is lower than the verification voltage VVC, the read voltage VRD is lower than the verification voltage VVD, the read voltage VRE is lower than the verification voltage VVE, the read voltage VRF is lower than the verification voltage VVF, and the read voltage VRG is lower than the verification voltage VVG.

Furthermore, a read path voltage VREAD is set so as to be always higher than the threshold voltage of the cell transistor CT in the highest "G" state. When the read path voltage VREAD is applied to the gate of a certain cell transistor CT, the cell transistor CT is in the ON state regardless of the data to be stored.

It is noted that the number of bits of the data stored in one cell transistor CT described above and the allocation of the data to the threshold voltage distribution are merely examples, and the embodiments are not limited thereto.

Figure 6:
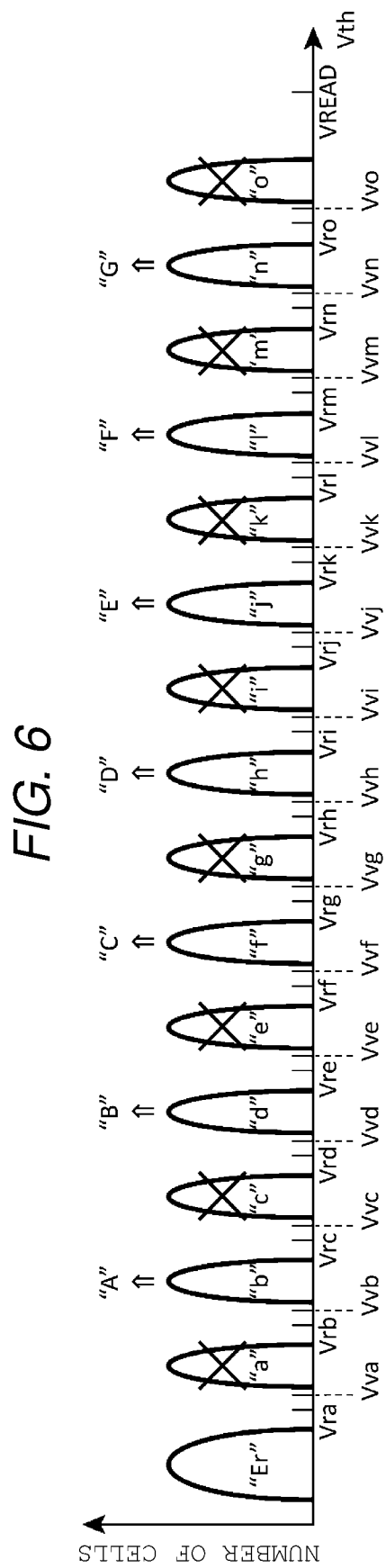
FIG. 6 is a diagram illustrating formation of a threshold voltage distribution to reduce a bit error rate when the semiconductor storage device according to the first embodiment executes a read operation.

FIG. 6 is a diagram illustrating the formation of a threshold voltage distribution that can reduce a bit error rate (BER) when the semiconductor storage device 1 according to the first embodiment executes the read operation. FIG. illustrates an example of the threshold voltage distribution, the read voltage, and the verification voltage when each cell transistor CT of the memory cell array 10 illustrated in FIG. 3 stores 4-bit data in the QLC mode.

FIG. 6 schematically illustrates, as an example of 16 threshold voltage distributions formed as a result of the same control as described with reference to FIG. 5 for the program operation, an example of a graph obtained by plotting the number of cell transistors CT such that the threshold voltage of the cell transistor CT is a certain value and the value thereof as a variable similarly to FIG. 5.

The 16 threshold voltage distributions are associated with, for example, an "Er" state, an "a" state, a "b" state, a "c" state, a "d" state, an "e" state, an "f" state, a "g" state, an "h" state, an "i" state, a "j" state, a "k" state, an "1" state, an "m" state, an "n" state, and an "o" stat, respectively. According to the threshold voltage of the cell transistor CT, the cell transistor CT is distinguished as being in any of these states. In the cell transistor CT, the threshold voltage of the cell transistor CT is increased in the order of the "Er" state, the "a" state, the "b" state, the "c" state, the "d" state, the "e" state, the "f" state, the "g" state, the "h" state, the "i" state, the "j" state, the "k" state, the "1" state, the "m" state, the "n" state, and the "o" state.

The verification voltage used as described with reference to FIG. 5 is set in associated with each of these states. Specifically, a voltage Vva, a voltage Vvb, a voltage Vvc, a voltage Vvd, a voltage Vve, a voltage Vvf, a voltage Vvg, a voltage Vvh, a voltage Vvi, a voltage Vvj, a voltage Vvk, a voltage Vvl, a voltage Vvm, Voltage Vvn, and a voltage Vvo are set in order from the lowest voltage.

The read voltage used as described with reference to FIG. 5 is set in associated with each of these states. Specifically, a voltage Vra, a voltage Vrb, a voltage Vrc, a voltage Vrd, a voltage Vre, a voltage Vrf, a voltage Vrg, a voltage Vrh, a voltage Vri, a voltage Vrj, a voltage Vrk, a voltage Vrl, a voltage Vrm, a voltage Vrn, and a voltage Vro are set in order from the lowest a voltage.

Each read voltage is lower than the verification voltage set in association with the same state as the read voltage. The read path voltage VREAD described with reference to FIG. 5 is always higher than the threshold voltage of the cell transistor CT in the highest "o" state.

A case where the control to perform the write operation in the QLC mode is utilized when the semiconductor storage device 1 executes the write operation in the TLC mode will be described.

In the write operation in the QLC mode, the program operation and the verification operation may be executed so that the threshold voltage of each cell transistor CT reaches any of the voltage Vvb, the voltage Vvd, the voltage Vvf, the voltage Vvh, the voltage Vvj, the voltage Vvl, and the voltage Vvn.

When the semiconductor storage device 1 receives a command for executing a write operation in the TLC mode from the memory controller 2, for example, the semiconductor storage device 1 executes such a write operation in the QLC mode instead of the write operation in the TLC mode. In the write operation executed in this manner, the control described below is specifically performed.

Instead of controlling the threshold voltage of the cell transistor CT to reach the voltage VVA in the TLC mode, control is performed to allow the threshold voltage to reach the voltage Vvb in the QLC mode. As a result, the threshold voltage distribution in the "b" state illustrated in FIG. 6 is formed, and it is considered that the threshold voltage distribution is the threshold voltage distribution in the "A" state.

Instead of controlling the threshold voltage of the cell transistor CT to reach the voltage VVB in the TLC mode, control is performed to allow the threshold voltage to reach the voltage Vvd in the QLC mode. As a result, the threshold voltage distribution in the "d" state illustrated in FIG. 6 is formed, and it is considered that the threshold voltage distribution is the threshold voltage distribution in the "B" state.

Instead of controlling the threshold voltage of the cell transistor CT to reach the voltage VVC in the TLC mode, control is performed to allow the threshold voltage to reach the voltage Vvf in the QLC mode. As a result, the threshold voltage distribution in the "f" state illustrated in FIG. 6 is formed, and it is considered that the threshold voltage distribution is the threshold voltage distribution in the "C" state.

Instead of controlling the threshold voltage of the cell transistor CT to reach the voltage VVD in the TLC mode, control is performed to allow the threshold voltage to reach the voltage Vvh in the QLC mode. As a result, the threshold voltage distribution in the "h" state illustrated in FIG. 6 is formed, and it is considered that the threshold voltage distribution is the threshold voltage distribution in the "D" state.

Instead of controlling the threshold voltage of the cell transistor CT to reach the voltage VVE in the TLC mode, control is performed to allow the threshold voltage to reach the voltage Vvj in the QLC mode. As a result, the threshold voltage distribution in the "j" state illustrated in FIG. 6 is formed, and it is considered that the threshold voltage distribution is threshold voltage distribution in the "E" state.

Instead of controlling the threshold voltage of the cell transistor CT to reach the voltage VVF in the TLC mode, control is performed to allow the threshold voltage to reach the voltage Vvl in the QLC mode. As a result, the threshold voltage distribution in the "l" state illustrated in FIG. 6 is formed, and it is considered that the threshold voltage distribution is threshold voltage distribution in the "F" state.

Instead of controlling the threshold voltage of the cell transistor CT to reach the voltage VVG in the TLC mode, control is performed to allow the threshold voltage to reach the voltage Vvn in the QLC mode. As a result, the threshold voltage distribution in the "n" state illustrated in FIG. 6 is formed, and it is considered that the threshold voltage distribution is threshold voltage distribution in the "G" state.

Although not illustrated in the graphs of FIGS. 5 and 6, the threshold voltage distribution of a certain state may partially overlap the threshold voltage distribution of adjacent states on the graph.

When the semiconductor storage device 1 executes the write operation in the TLC mode by utilizing the control for the QLC mode in this manner, as compared with the case where the control for the QLC mode is not utilized, a portion where each of the formed eight threshold voltage distributions overlaps the adjacent threshold voltage distribution on the graph is smaller. This denotes that, when the semiconductor storage device 1 reads the data written in this manner during the read operation, the bit error rate can be reduced.

In the above description, it is described that when each cell transistor CT of the memory cell array 10 stores 3 bits of data in the TLC mode, the semiconductor storage device 1 may reduce the bit error rate in the read operation by utilizing the control for the QLC mode. The semiconductor storage device 1 may utilize another control that causes each memory cell to store data having a number of bits larger than that of the QLC mode. In this manner, the semiconductor storage device 1 can execute the write operation by utilizing the control used to store the data having a number of bits larger than the number of bits of the data to be stored in each cell transistor CT of the memory cell array 10.

(5) Group Selected Transistor

Hereinafter, each cell transistor CT in the NAND string NS connected to a certain bit line BL is referred to as a cell transistor CT connected to the bit line BL.

Each of the bit lines BL0 to BL(m−1) illustrated in FIG. 3 is provided in any of the plurality of bit line groups BLG. Each of the bit line groups BLG is configured with, for example, a plurality of bit lines BL. The number of bit lines BL constituting one bit line group BLG may or may not be the same among all the bit line groups BLG. In this specification, the name of the bit line group BLG is used for the convenience, but there may be the bit line group BLG configured with one bit line BL. These bit line groups BLG are defined, for example, as units of plane PB described with reference to FIG. 2.

The semiconductor storage device 1 can execute the read operation for a certain block BLK of the plane PB illustrated in FIG. 2 as a target in units of the bit line group BLG. Hereinafter, a case will be described in which the semiconductor storage device 1 can execute the read operation in units of the bit line group BLG when any of blocks BLK of the plane PB is set as a target. Hereinafter, one block BLK of the plane PB will be described as an example. The following description also applies to the other blocks BLK of the plane PB.

The read operation can be executed in units of the bit line group BLG by setting the threshold voltage of each of the cell transistors CT connected to the plurality of word lines WL related to the block BLK. Hereinafter, each of such word lines WL is also referred to as a group-selection word line GWL, and each of such cell transistors CT is also referred to as a group-selection transistor GCT.

Figure 7:
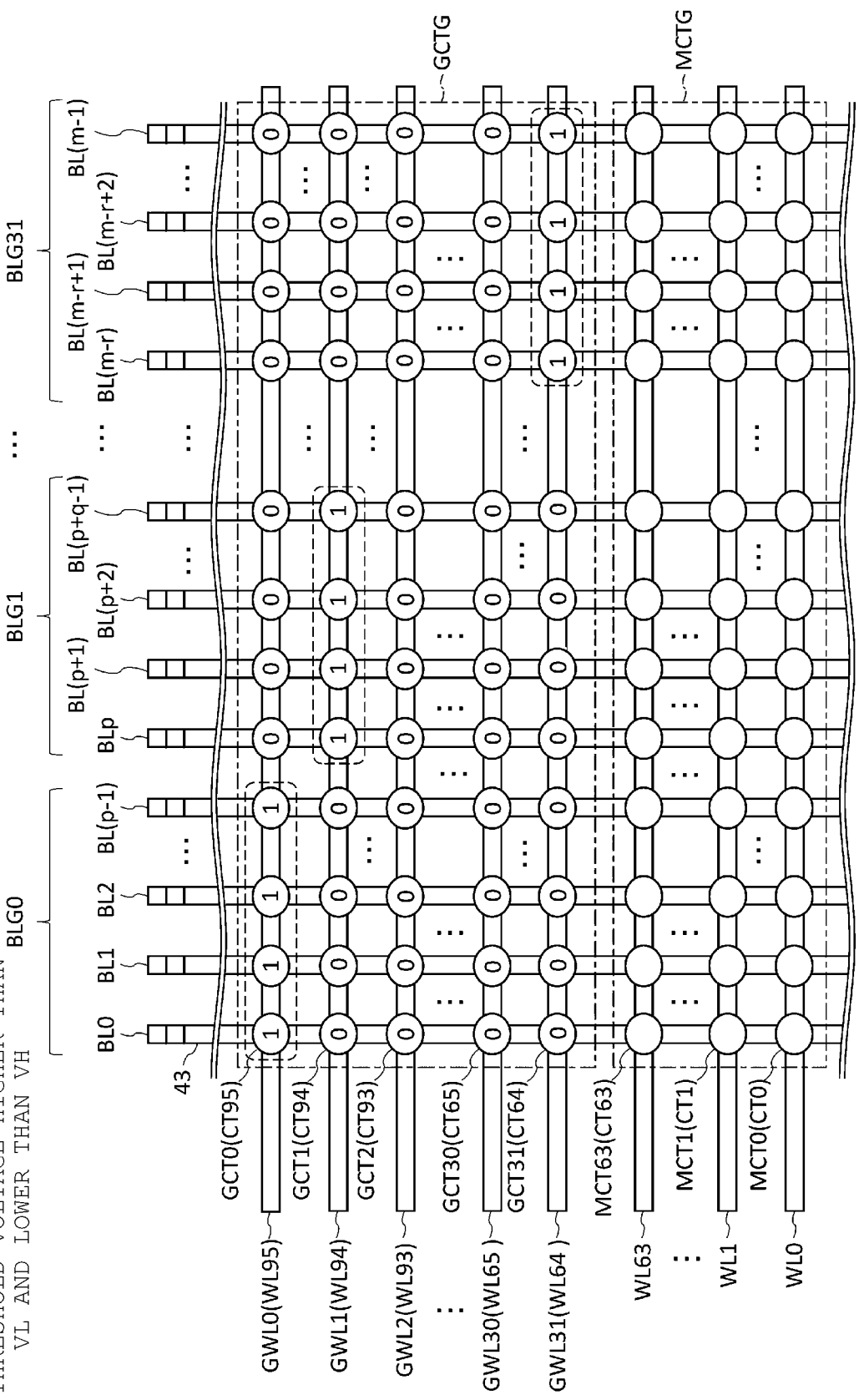
FIG. 7 is a diagram illustrating an example of setting a threshold voltage of each group-selection transistor in a certain string unit in a figure schematically illustrating a portion of the cross-sectional structure of the memory cell array of the semiconductor storage device according to the first embodiment.

FIG. 7 illustrates an example of setting the threshold voltage of each group-selection transistor GCT in a certain string unit SU of the block BLK in a diagram schematically illustrating a portion of the cross-sectional structure of the memory cell array 10 of the semiconductor storage device 1 according to the first embodiment. Hereinafter, the string unit SU will be described as an example, but the following description also applies to the other string units SU of the block BLK. Hereinafter, the case where the 32 bit line groups BLG are configured with the bit lines BL0 to BL(m−1) is described as an example, but the number of bit line groups BLG configured with the bit lines BL0 to BL(m−1) is not limited to 32.

For example, the word line WL95 functions as a group-selection word line GWL0, a word line WL94 functions as a group-selection word line GWL1, a word line WL93 functions as a group-selection word line GWL2, . . . , a word line WL65 functions as a group-selection word line GWL30, and a word line WL64 functions as a group-selection word line GWL31.

For each of the bit lines BL0 to BL(m−1), among the cell transistors CT connected to the bit line BL, each of cell transistors CT95, CT94, CT93, . . . , and CT64 connected to the group-selection word lines GWL0 to GWL31 functions as the group-selection transistor GCT. More specifically, the cell transistor CT95 functions as a group-selection transistor GCT0, the cell transistor CT94 functions as a group-selection transistor GCT1, the cell transistor CT93 functions as a group-selection transistor GCT2, . . . , the cell transistor CT65 functions as a group-selection transistor GCT30, and the cell transistor CT64 functions as a group-selection transistor GCT31. In FIG. 7, for the reference, the cell transistor CT functioning as the group-selection transistor GCT is surrounded by a frame denoted by the reference numeral GCTG.

In the example of FIG. 7, a bit line group BLG0 is configured with p bit lines BL0, BL1, . . . , and BL(p−1); a bit line group BLG1 is configured with q bit lines BLp, BL(p+1), and BL(p+q−1); and a bit line group BLG31 is configured with r bit lines BL(m−r), BL(m−r+1), . . . , and BL(m−1). It is noted that each of p, q, and r is an integer of 1 or more, and the sum of p, q, and r is smaller than m. In order that the bit line groups BLG0 to BLG31 are configured with the bit lines BL0 to BL(m−1), the threshold voltage of each group-selection transistor GCT is described below.

First, the threshold voltage of each group-selection transistor GCT is lower than a voltage VL, higher than the voltage V, or lower than a voltage VH. The voltage VL may match any read voltage such as a voltage VRA. When the voltage VL matches any read voltage, the voltage VH may match any read voltage that is higher than the read voltage that matches the voltage VL. Alternatively, the voltage VH may match the voltage VREAD.

Hereinafter, when the threshold voltage of the group-selection transistor GCT is lower than the voltage VL, the threshold voltage of the group-selection transistor GCT is described to be classified as a type "0" and when the threshold voltage of the group-selection transistor GCT is lower than the voltage VH but higher than the voltage VL, the threshold voltage of the group-selection transistor GCT is described to be classified as a type "1".

In the example of FIG. 7, for each bit line BL, among the group-selection transistors GCT0 to GCT31 connected to the bit line BL, the number of group-selection transistors GCT having the threshold voltage classified as a type "1" is 1. Such a threshold voltage of each group-selection transistor GCT is controlled in the same manner as in the case of the program operation described with reference to, for example, FIG. 5.

For each of the bit lines BLp, BL(p+1), . . . , and BL(p+q−1) constituting the bit line group BLG1, the following conditions are satisfied for the group-selection transistors GCT related to the bit line group BL. That is, among the threshold voltages of the group-selection transistors GCT connected to the bit line BL, the threshold voltage of the transistor GCT0 is classified as a type "1", and each of the threshold voltages of the other transistors GCT is classified as a type "0", respectively.

For each of the bit lines BLp, BL(p+1), . . . , and BL(p+q−1) constituting the bit line group BLG1, the following conditions are satisfied for the group-selection transistors GCT related to the bit line group BL. That is, among the threshold voltages of the group-selection transistors GCT connected to the bit line BL, the threshold voltage of the transistor GCT1 is classified as a type "1", and each of the threshold voltages of the other transistors GCT is classified as a type "0", respectively.

Similarly, for each of the bit lines BL constituting a bit line group BLG2, among the threshold voltages of the group-selection transistors GCT connected to the bit line BL, only the threshold voltage of the transistor GCT2 is classified as a type "1". Furthermore, for each of the bit lines BL constituting a bit line group BLG3, among the threshold voltages of the group-selection transistors GCT connected to the bit line BL, only the threshold voltage of a transistor GCT3 is classified as a type "1". Hereinafter, the same is applied.

Finally, for each of the bit lines BL(m−r), BL(m−r+1), . . . , and BL(m−1) constituting the bit line group BLG31, the following conditions are satisfied for the group-selection transistors GCT related to the bit line BL. That is, among the threshold voltages of the group-selection transistors GCT connected to the bit line BL, the threshold voltage of the transistor GCT31 is classified as a type "1", and each of the threshold voltages of the other transistors GCT is classified as a type "0", respectively.

As described above, for each of the bit lines BL0 to BL(m−1), among the cell transistors CT connected to the bit line BL, each of the cell transistors CT95, CT94, CT93, . . . , and CT64 is described to function as the group-selection transistor GCT. Each of the remaining cell transistors CT0, CT1, . . . , and CT63 connected to the bit line BL functions as memory cell transistors MCT. Hereinafter, each cell transistor CT0 is also referred to as a memory cell transistor MCT0, each cell transistor CT1 is also referred to as a memory cell transistor MCT1, and each cell transistor CT63 is also referred to as a memory cell transistor MCT63. In FIG. 7, for the reference, the cell transistor CT functioning as the memory cell transistor MCT is surrounded by a frame denoted by the reference numeral MCTG.

In the example of FIG. 7, among the word lines WL related to the block BLK, the word lines WL functioning as the group-selection word lines GWL are selected in order from the word line WL located on the bit line BL side. As already illustrated in FIG. 4, the group-selection word line GWL is between the word line WL that does not function as the group-selection word line GWL and the bit line BL. Therefore, the group-selection word line GWL is used to control whether to enable the sense amplifier module 11 to access the memory cell transistor MCT connected to the word line WL via the bit line BL.

In the example of FIG. 7, a plurality of bit lines BL constituting the same bit line group BLG are illustrated to be adjacent to each other, but the bit lines BL constituting the same bit line group BLG are not necessarily adjacent to each other.

FIG. 8 illustrates a table listing setting of the threshold voltage of each group-selection transistor GCT described with reference to FIG. 7.

In the table, for each of the bit line groups BLG, illustrated is the setting of the threshold voltage of each group-selection transistor GCT related to the bit line BL constituting the bit line group BLG. More specifically, for each of the bit lines BL constituting the bit line group BLG, illustrated is the setting of the threshold voltage of each group-selection transistor GCT connected to the bit line BL. 0 and 1 in the table indicate the threshold voltage classified as a type and the threshold voltage classified as a type "1", respectively.

Subsequently, among the word lines WL related to a certain block BLK, how many bit line groups BLG may be configured with the bit lines BL0 to BL(m−1) according to the number of word lines WL used as the group-selection word line GWL will be described.

In the examples of FIGS. 7 and 8, for each of the bit lines BL configuring a certain bit line group BLG, among the threshold voltages of the group-selection transistors GCT connected to the bit line BL, only the threshold voltage of the transistor GCT connected to a certain group-selection word line GWL is classified as a type "1". This applies to any bit line group BLG, but the group-selection word line GWL is different when the bit line group BLG is different. As described above, in the examples of FIGS. 7 and 8, the bit line groups BLG are associated with the respective group-selection word lines GWL on a one-to-one basis. In the examples of FIGS. 7 and 8, the number of the bit line groups BLG are the same as the number of the group-selection word lines GWL that can be associated with each other. That is, the number of the bit line groups BLG is equal to the number of patterns of selecting one among 32 group-selection word lines GWL.

FIG. 9 illustrates a table listing how many bit line groups BLG can be configured with the bit lines BL0 to BL(m−1) according to the number of group-selection word lines GWL related to a certain block BLK of the memory cell array 10 of the semiconductor storage device 1 according to the first embodiment.

As in the example of FIG. 7, the number of the bit line groups BLG is equal to the number of patterns of selecting one among the group-selection word line GWL, and therefore, the number of the bit line groups BLG is equal to the number of group-selection word lines GWL.

In the table, it is illustrated that 32 bit line groups BLG may be configured when the number of group-selection word lines GWL is 32. This corresponds to the examples of FIGS. 7 and 8.

(6) Sense Amplifier Module

Figure 10:
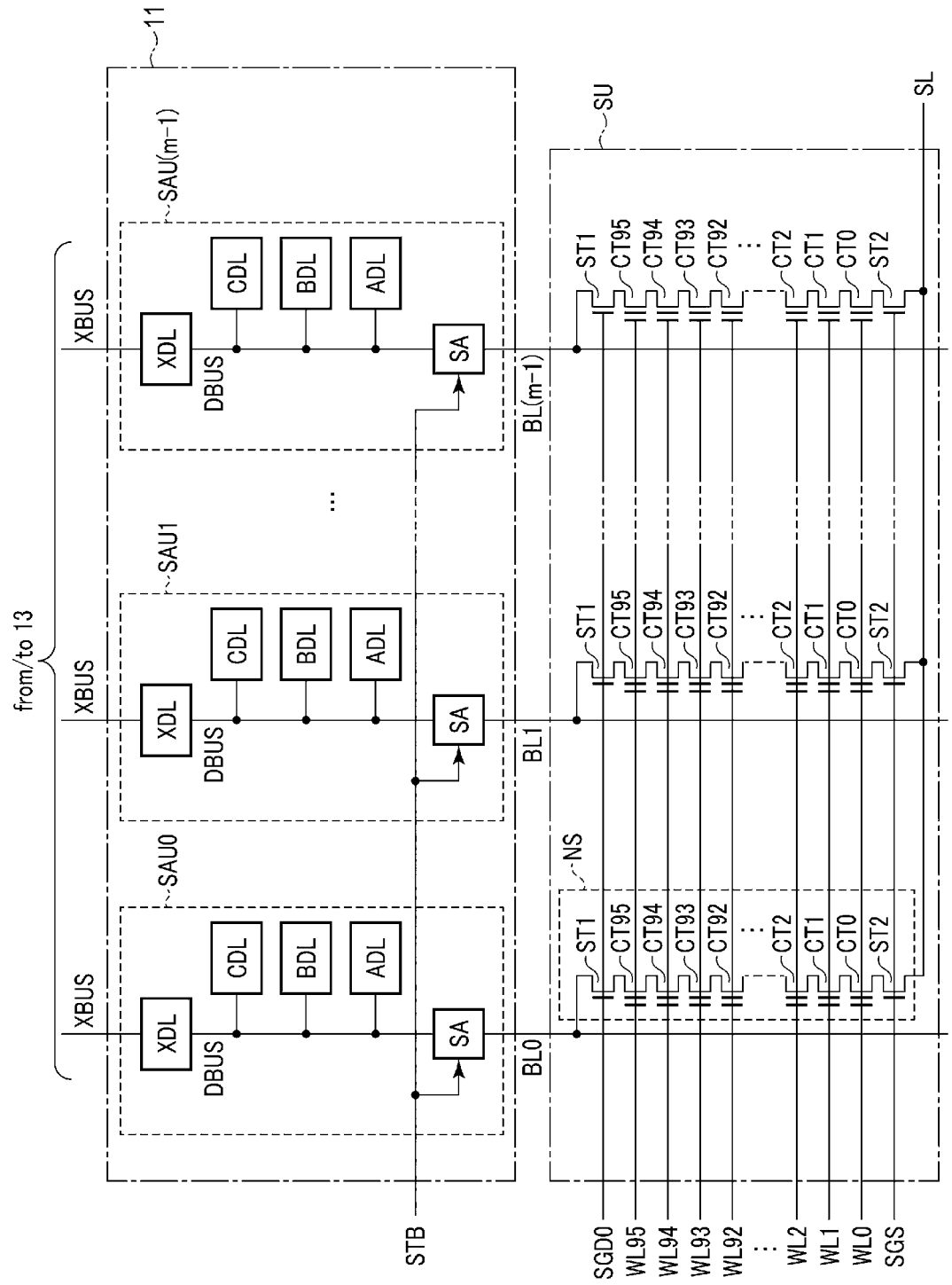
FIG. 10 is a block diagram illustrating an example of a configuration of a sense amplifier module of the semiconductor storage device according to the first embodiment.

FIG. 10 is a block diagram illustrating an example of a configuration of the sense amplifier module 11 of the semiconductor storage device 1 according to the first embodiment. The configuration of the sense amplifier module described below is only an example, and various configurations may be applied to the sense amplifier module 11.

The sense amplifier module 11 includes, for example, m sense amplifier units SAU0 to SAU(m−1). The m sense amplifier units SAU0 to SAU(m−1) are associated with, for example, m bit lines BL0 to BL(m−1) on a one-to-one basis, respectively.

Each sense amplifier unit SAU includes, for example, a sense amplifier circuit SA and latch circuits ADL, BDL, CDL, and XDL. The number of latch circuits provided in each sense amplifier unit SAU is based on, for example, the number of bits of data stored by each memory cell transistor MCT. The description will be focused on a certain sense amplifier unit SAU with respect to the sense amplifier circuit SA and the latch circuits ADL, BDL, CDL, and XDL.

The sense amplifier circuit SA is connected to the bit line BL associated with the sense amplifier unit SAU. The sense amplifier circuit SA and the latch circuits ADL, BDL, CDL, and XDL are commonly connected to a bus DBUS.

The sense amplifier circuit SA applies a voltage to the bit line BL during the write operation. The sense amplifier circuit SA reads data stored in the memory cell transistor MCT by sensing change of a current flowing through the bit line BL or a potential of the bit line BL during the read operation. During the read operation, the control signal STB is supplied to the sense amplifier circuit SA by, for example, the sequencer 16. The sense amplifier circuit SA determines the data at timing when the control signal STB is asserted and outputs the data to the bus DBUS.

The latch circuits ADL, BDL, and CDL receive the data, for example, via the bus DBUS and temporarily store the received data.

The latch circuit XDL is connected to a certain bus XBUS. The latch circuit XDL is connected to the input/output circuit 13 via the bus XBUS.

The latch circuit XDL enables transmission/reception of the data between the sense amplifier unit SAU and the input/output circuit 13. During the write operation, a certain bit of the data received by the semiconductor storage device 1 from the memory controller 2 is first stored in the latch circuit XDL and then transferred to the latch circuits ADL, BDL, and CDL, or the sense amplifier circuit SA. During the read operation, the data in the latch circuits ADL, BDL, and CDL, or the sense amplifier circuit SA is first transferred to and stored in the latch circuit XDL and, after that, the data is transferred to the input/output circuit 13 and outputs to the outside of the semiconductor storage device 1. In this manner, the latch circuit XDL functions as a cache memory of the semiconductor storage device 1 connected in series between the input/output circuit 13 and the sense amplifier circuit SA.

During the read operation, for example, the data read from the plurality of memory cell transistors MCT via the plurality of bit lines BL is transferred to and stored in the plurality of latch circuits XDL in this manner, and after that, the data is transferred to the input/output circuit 13 and outputs to the outside of the semiconductor storage device 1.

(7) Driver Set and Row Decoder Module

Figure 11:
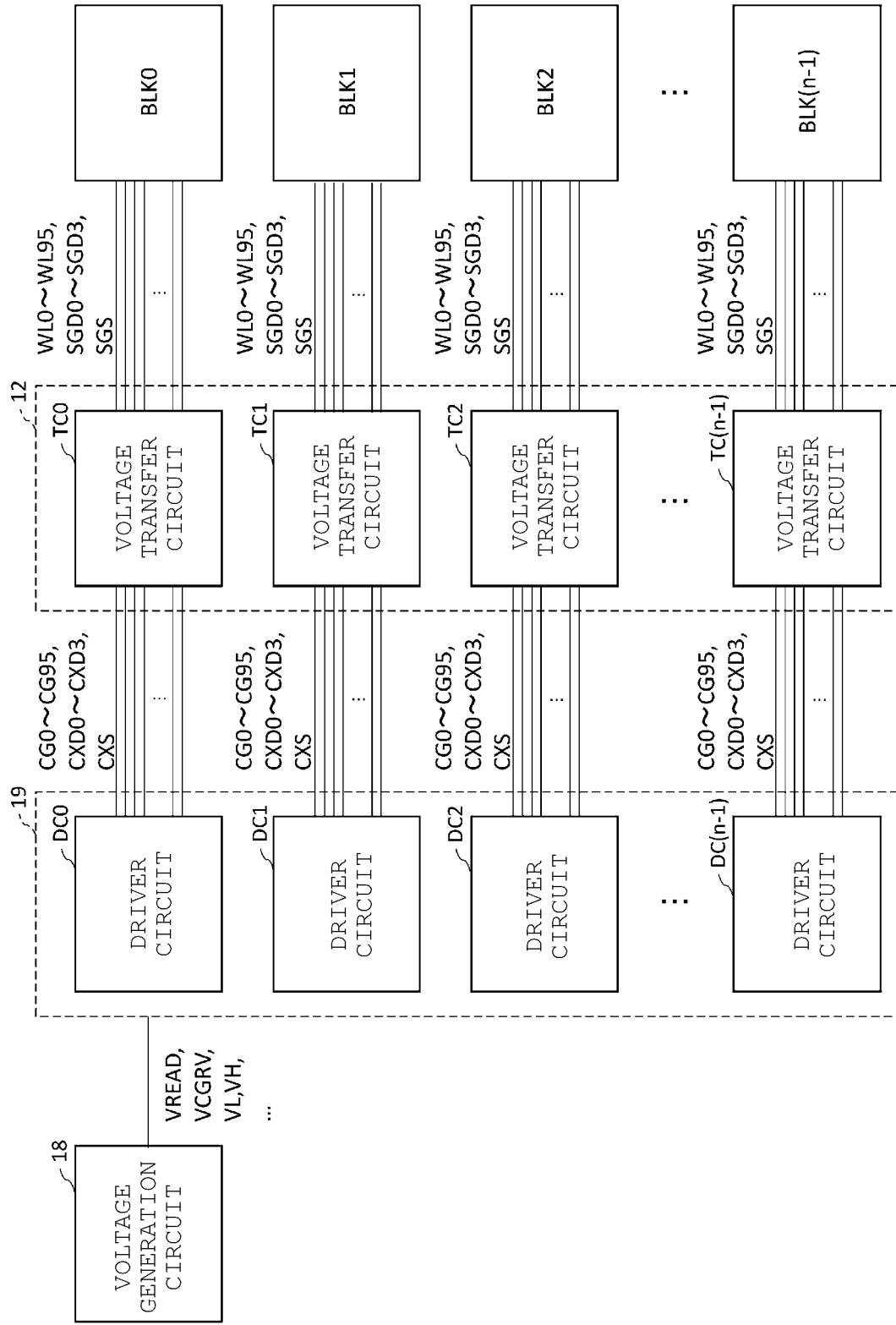
FIG. 11 is a diagram illustrating an example of a configuration of a driver set and a row decoder module of the semiconductor storage device according to the first embodiment.

FIG. 11 illustrates an example of a configuration of the driver set 19 and the row decoder module 12 of the semiconductor storage device 1 according to the first embodiment.

The driver set 19 includes driver circuits DC0, DC1, DC2, . . . , and DC(n−1). The row decoder module 12 includes voltage transfer circuits TC0, TC1, TC2, . . . , and TC(n−1).

The driver circuits DC0, DC1, DC2, . . . , and DC(n−1) are associated with the voltage transfer circuits TC0, TC1, TC2, . . . , and TC(n−1) on a one-to-one basis in the order of appearance, respectively. The voltage transfer circuits TC0, TC1, TC2, . . . , and TC(n−1) are associated with the blocks BLK0, BLK1, BLK2, . . . , and BLK(n−1) on a one-to-one basis in this order, respectively. The driver circuits DC0, DC1, DC2, . . . , and DC(n−1) are also associated with the blocks BLK0, BLK1, BLK2, ... , and BLK(n−1) on a one-to-one basis in this order, respectively.

Each driver circuit DC is connected to, for example, 96 wirings CG0 to CG95, four wirings CXD0 to CXD3, and wiring CXS. The wirings CG0 to CG95, CXD0 to CXD3, and CXS are connected to the voltage transfer circuit TC associated with the driver circuit DC. Such a set of the wirings CG0 to CG95, CXD0 to CXD3, and CXS is provided, for example, for each driver circuit DC.

Each voltage transfer circuit TC is connected to, for example, the 96 word lines WL0 to WL95, the four select gate lines SGD0 to SGD3, and the select gate line SGS described with reference to FIG. 3. The word lines WL0 to WL95, and the select gate lines SGD0 to SGD3 and SGS are in the connection relationship described with reference to FIG. 3 between the cell transistor CT or the select transistor ST in the block BLK associated with the voltage transfer circuit TC. The word lines WL0 to WL95 and the select gate lines SGD0 to SGD3 and SGS are associated with the wirings CG0 to CG95, CXD0 to CXD3, and CXS connected to the voltage transfer circuit TC on a one-to-one basis in this order, respectively. Such a set of the word lines WL0 to WL95 and the select gate lines SGD0 to SGD3 and SGS is provided, for example, for each voltage transfer circuit TC, that is, for each block BLK.

The voltage generation circuit 18 generates various voltages such as the voltages VCGRV and VREAD used in the read operation, and supplies the generated voltages to the driver set 19. The voltage VCGRV is a collective term for the verification voltage or the read voltage described with reference to FIG. 5. The voltage generation circuit 18 further generates the voltage VH and the voltage VL and supplies the voltage VH and the voltage VL to the driver set 19. In addition to these voltages supplied from the voltage generation circuit 18, for example, a voltage VSS and the like are also supplied to the driver set 19. The voltage VSS is a certain reference voltage.

Each driver circuit DC transfers a certain voltage among the voltages supplied to the driver set 19 to each of the wirings CG0 to CG95, CXD0 to CXD3, and CXS connected to the driver circuit DC based on, for example, a block address, a page address, a string address, and the like. Each driver circuit DC may perform the voltage transfer based on the address information ADD2 during the read operation.

The voltage transfer circuit TC associated with the driver circuit DC enables the wirings CG0 to CG95, CXD0 to CXD3, and CXS to be electrically connected to the word lines WL0 to WL95 connected to the voltage transfer circuit TC and the wirings associated with the select gate lines SGD0 to SGD3 and SGS, respectively. By the electrical connection, each of the voltages transferred to the wirings CG0 to CG95, CXD0 to CXD3, and CXS are transferred to the word lines WL0 to WL95 and the select gate lines SGD0 to SGD3 and SGS and further transferred to the block BLK associated with the voltage transfer circuit TC.

Figure 12:
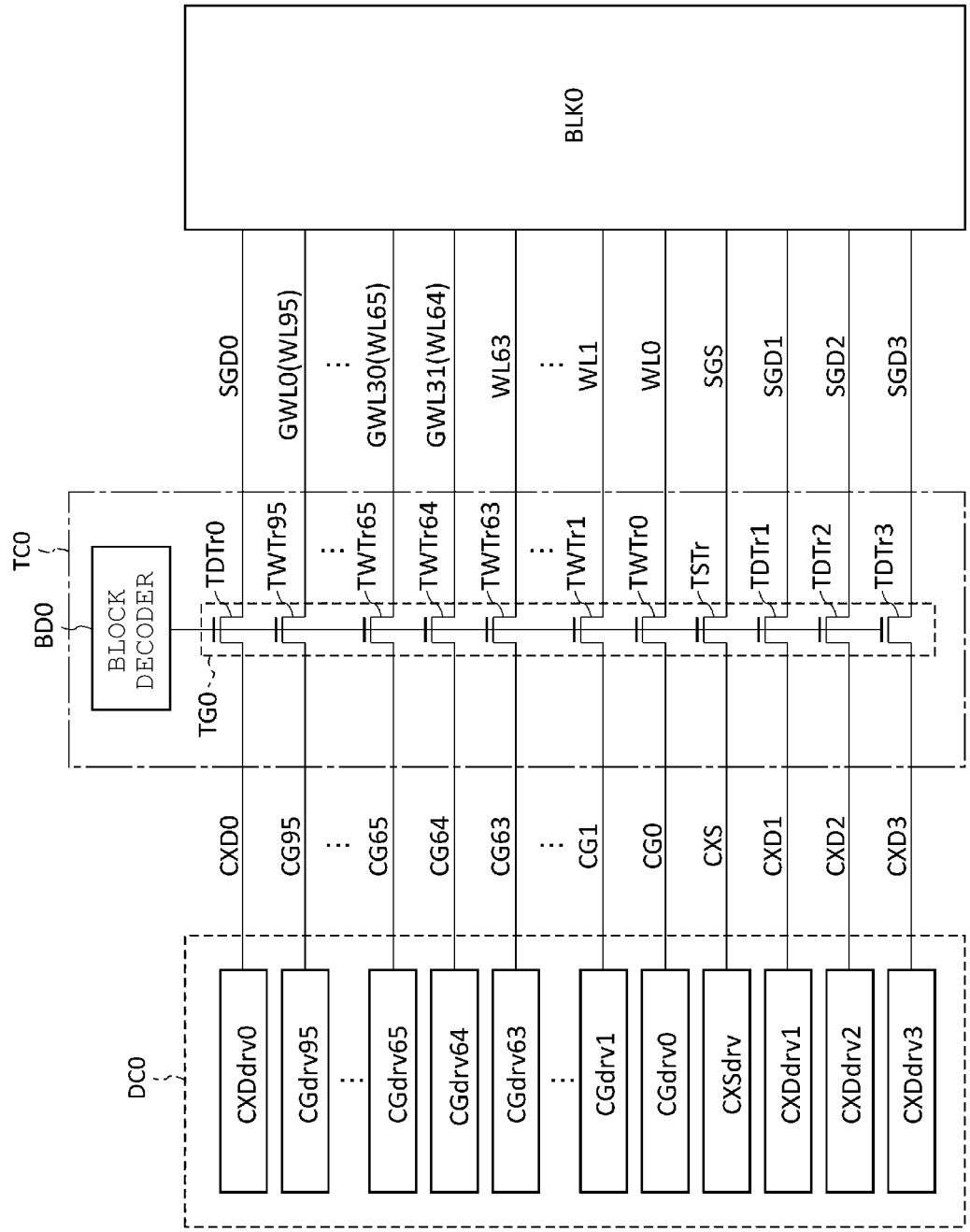
FIG. 12 is a diagram illustrating an example of a configuration of a certain driver circuit and a certain voltage transfer circuit of the semiconductor storage device according to the first embodiment.

FIG. 12 illustrates an example of the configurations of the driver circuit DC0 and the voltage transfer circuit TC0 of the semiconductor storage device 1 according to the first embodiment. Hereinafter, the driver circuit DC0 and the voltage transfer circuit TC0 will be described, but for example, the same description applies to the other driver circuit DC and the voltage transfer circuit TC associated with the driver circuit DC.

The driver circuit DC0 includes, for example, drivers CGdrv0, CGdrv1, ... , CGdrv95, CXDdrv0, CXDdrv1, CXDdrv2, CXDdrv3, and CXSdrv.

The connection between the driver circuit DC0 and the wirings CG0 to CG95, CXD0 to CXD3, and CXS described with reference to FIG. 11 will be described in more detail.

The driver CGdrv0 is connected to the wiring CG0, the driver CGdrv1 is connected to a wiring CG1, the driver CGdrv2 is connected to a wiring CG2, ... , and the driver CGdrv95 is connected to a wiring CG95. The driver CXDdrv0 is connected to the wiring CXD0, the driver CXDdrv1 is connected to a wiring CXD1, the driver CXDdrv2 is connected to a wiring CXD2, and the driver CXDdrv3 is connected to a wiring CXD3. The driver CXSdrv is connected to the wiring CXS.

Each of the drivers CGdrv0 to CGdrv95, CXDdrv0 to CXDdrv3, and CXSdrv transfers a certain voltage among the voltages supplied to the driver set 19 to the connected wiring among the wirings CG0 to CG95, CXD0 to CXD3, and CXS.

The voltage transfer circuit TC0 includes a block decoder BD0 and a transistor group TG0. The transistor group TG0 includes transistors TWTr0, TWTr1, ... , TWTr95, TDTr0, TDTr1, TDTr2, TDTr3, and TSTr. Each of these transistors is a field effect transistor (FET) such as an n-channel Metal Oxide Semiconductor (MOS) transistor.

The output end of the block decoder BD0 is connected to the gate of each of the transistors TWTr0, TWTr1, ... , TWTr95, TDTr0, TDTr1, TDTr2, TDTr3, and TSTr.

The first end of the transistor TWTr0 is connected to the wiring CG0, and the second end of the transistor TWTr0 is connected to the word line WL0. The first end of the transistor TWTr1 is connected to the wiring CG1, and the second end of the transistor TWTr1 is connected to the word line WL1. Hereinafter, the same is applied, and thus, the first end of the transistor TWTr95 is connected to the wiring CG95, and the second end of the transistor TWTr95 is connected to the word line WL95.

The first end of the transistor TDTr0 is connected to the wiring CXD0, and the second end of the transistor TDTr0 is connected to the select gate line SGD0. The first end of the transistor TDTr1 is connected to the wiring CXD1, and the second end of the transistor TDTr1 is connected to the select gate line SGD1. Hereinafter, the same is applied, and thus, the first end of the transistor TDTr3 is connected to the wiring CXD3, and the second end of the transistor TDTr3 is connected to the select gate wire SGD3.

The first end of the transistor TSTr is connected to the wiring CXS, and the second end of the transistor TSTr is connected to the select gate line SGS.

The block decoder BD0 decodes the block address. When the block address matches the block address allocated to the block BLK0 associated with the voltage transfer circuit TC0 including the block decoder BD0, the block decoder BD0 increases the level of the voltage output from the output end of the block decoder BD0. Accordingly, the transistors TWTr0, TWTr1, ... , TWTr95, TDTr0, TDTr1, TDTr2, TDTr3, and TSTr, each of which has a gate connected to the output end, are in the ON state. Accordingly, as described with reference to FIG. 11, the wirings CG0 to CG95, CXD0 to CXD3, and CXS are electrically connected to the word lines WL0 to WL95 and the select gate lines SGD0 to SGD3 and SGS, respectively.

OPERATIONAL EXAMPLE

Hereinafter, some operational examples in which the memory controller 2 transmits the command set to the semiconductor storage device 1 and the semiconductor storage device 1 performs operations based on the command set will be described in detail.

In the following description, the memory cell transistor MT as a write target or a read target is referred to as a selected memory cell transistor MCT. The selected memory cell transistor MCT is provided in the selected block BLK (sel) described above. Among the word lines WL related to the selected block BLK(sel), the word line WL connected to the selected memory cell transistor MCT is referred to as a selected word line WL(sel), and the other word lines WL are referred to as non-selected word lines WL(usel). The string unit SU including the selected memory cell transistor MCT is referred to as a string unit SU(sel). Among the select gate lines SGD related to the selected block BLK(sel), the select gate line SGD related to the string unit SU(sel) is referred to as a selected select gate line SGD(sel), and the other select gate lines SGD are referred to as non-selected select gate lines SGD(usel).

(1) Write Operation

Figure 13:
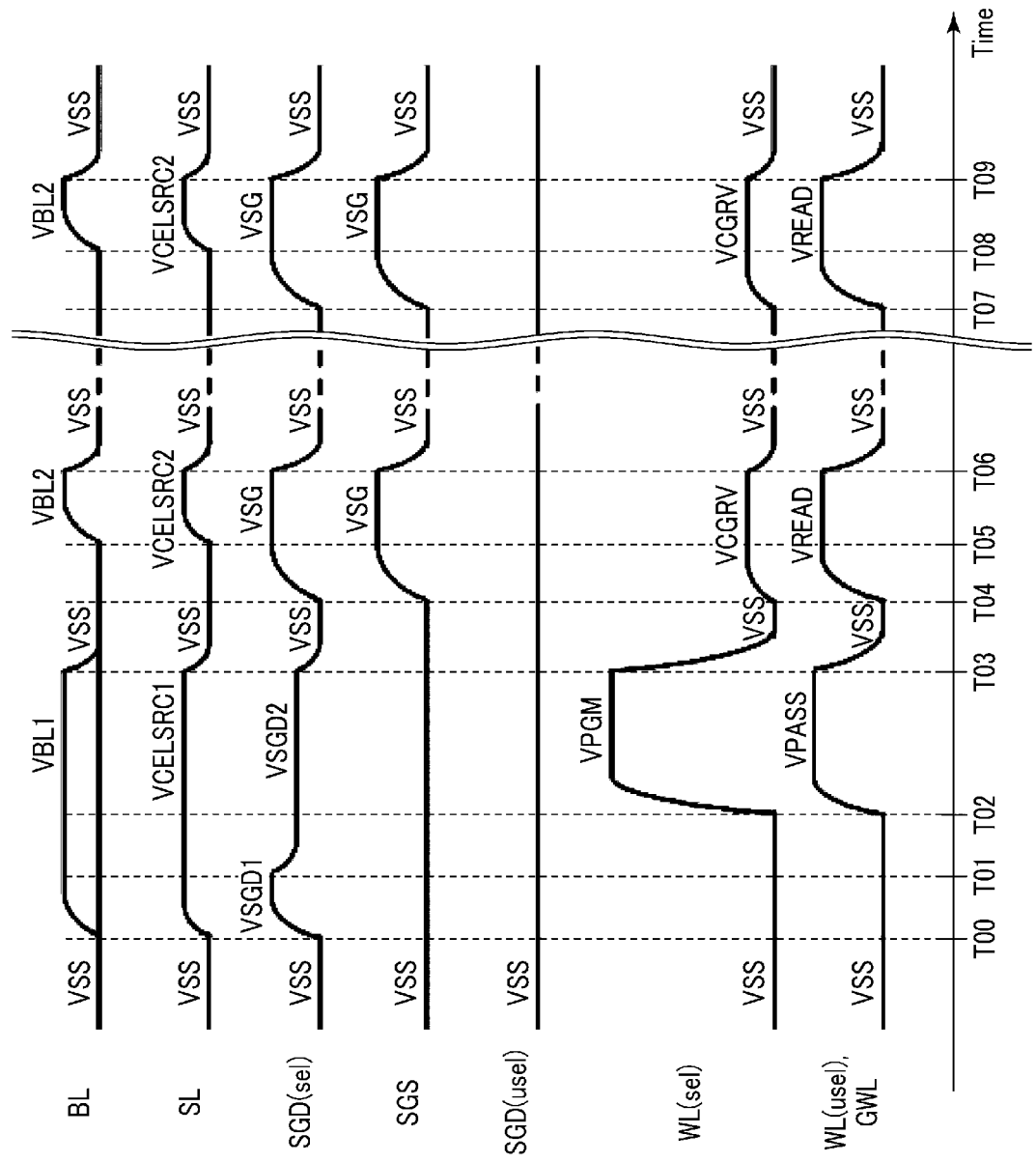
FIG. 13 is a diagram illustrating an example of a timing chart illustrating time changes of voltages applied to various wirings related to a selected block when the semiconductor storage device according to the first embodiment executes a write operation.

FIG. 13 illustrates an example of a timing chart illustrating time changes of voltages applied to various wirings related to the selected block BLK(sel) when the semiconductor storage device 1 according to the first embodiment executes the write operation. The write operation described below is only an example, and the write operation according to the present embodiment is not limited thereto. In the following description, when a voltage applied to a certain wiring is described, unless it is explicitly stated that another voltage will be applied to that wiring after that, it is assumed that that voltage will continue to be applied to that wiring.

The applying of the voltages to the word lines WL and the select gate lines SGD and SGS in the following description is implemented by, for example, the control of the voltage generation circuit 18, the driver set 19, and the row decoder module 12 by the sequencer 16. The applying of the voltage to the source line SL is implemented, for example, by the control of the voltage generation circuit 18 and the driver set 19 by the sequencer 16. The applying of the voltage to the bit line BL is executed, for example, by the control of the voltage generation circuit 18 and the sense amplifier module 11 by the sequencer 16.

Hereinafter, with respect to the non-selected word line WL(usel), the control of the voltage applied to a certain non-selected word line WL(usel) will be described. This is because the voltage applied to the other non-selected word line WL(usel) is controlled in the same manner. For the same reason as for the non-selected select gate line SGD(usel), the control of the voltage applied to a certain non-selected select gate line SGD(usel) will be described. For the same reason as for the group-selection word line GWL, the control of the voltage applied to a certain group-selection word line GWL will be described. Further, for the same reason as for the bit line BL, the control of the voltage applied to a certain bit line BL will be described.

Before the start of the write operation of the example of FIG. 13, the voltage VSS is applied to each of the word lines WL(sel), WL(usel), and GWL, the select gate lines SGD (sel), SGD(usel), and SGS, the bit line BL, and the source line SL.

First, the program operation is executed. Specifically, the details are as follows.

At time T00, the control described below is performed. When the threshold voltage of the selected memory cell transistor MCT connected to the bit line BL is increased by the program operation, the voltage applied to the bit line BL is maintained at the voltage VSS. On the other hand, when the threshold voltage is not increased by the program operation, the voltage applied to the bit line BL is increased from the voltage VSS to a voltage VBL1.

The voltage applied to the source line SL is changed from the voltage VSS to a voltage VCELSRC1. The voltage VCELSRC1 is a reference voltage different from the voltage VSS. The voltage applied to the selected select gate line SGD(sel) is increased from the voltage VSS to the voltage VSGD1.

Subsequently, at time T01, the voltage applied to the selected select gate line SGD(sel) is decreased from the voltage VSGD1 to the voltage VSGD2. The voltage VSGD2 is higher than the voltage VSS and lower than the voltage VBL1. The voltage VSGD2 is a voltage that causes the select transistor ST1 connected to the bit line BL to be in the ON state when the voltage VSS is applied to the bit line BL and causes the select transistor ST1 to be in the OFF state when the voltage VBL1 is applied to the bit line BL. It is noted that the voltage VSGD1 is applied to the selected select gate line SGD(sel) described above in order to shorten a period of time until, for example, the potential of the selected select gate line SGD(sel) of which potential is at the voltage VSS is stabilized at the voltage VSGD2. The voltage VSGD2 may be applied to the selected select gate line SGD(sel) without the voltage VSGD1 being applied.

After the potential of the wirings to which the voltage is applied is stabilized in this manner, the control described below is performed. It is noted that since the voltage VSS is applied to the select gate line SGS, the select transistor ST2 connected to the bit line BL is in the OFF state.

At time T02, the voltage applied to the selected word line WL(sel) is increased from the voltage VSS to a voltage VPGM, and each of the voltages applied to the non-selected word line WL(usel) and the group-selection word line GWL is increased from the voltage VSS to a voltage VPASS. The voltage VPASS is lower than the voltage VPGM. The voltage VPGM is a voltage used to inject electrons into the charge storage layer of the selected memory cell transistor MCT to increase the threshold voltage of the selected memory cell transistor MCT. In the NAND string NS including the select transistor ST1 in the ON state, the voltage VPASS is a voltage setting the memory cell transistor MCT connected to the non-selected word line WL(sel) to which the voltage VPASS is applied to be in the ON state but having a level capable of reducing programming to the memory cell transistor MCT. Furthermore, in the NAND string NS including the select transistor ST1 in the OFF state, the voltage VPASS is a voltage having a level capable of increasing a potential of the channel by coupling to the extent that the increase in the threshold voltage of the selected memory cell transistor MCT due to the applying of the voltage VPGM can be reduced.

Subsequently, at time T03, each of the voltages applied to the bit line BL, the source line SL, the selected select gate line SGD(sel), the selected word line WL(sel), the non-selected word line WL(usel), and the group-selection word line GWL is changed to the voltage VSS.

In this manner, the program operation is executed, and then the verification operation is executed. The details are as follows.

At time 104, the control described below is performed. Each of the voltages applied to the selected select gate line SGD(sel) and the select gate line SGS is increased from the voltage VSS to the voltage VSG. The voltage applied to the selected word line WL(sel) is changed from the voltage VSS to the voltage VCGRV. Each of the voltages applied to the non-selected word line WL(usel) and the group-selection word line GWL is increased from the voltage VSS to the voltage VREAD. The voltage VSG is a voltage that allows the select transistor ST to be in the ON state when the voltage is applied to the gate of the select transistor ST. The voltage VCGRV is any of the verified voltages VVA, VVB, VVC, VVD, VVE, VVF, and VVG described with reference to FIG. 5.

After the potential of the wiring to which the voltage is applied is stabilized in this manner, the control described below is performed.

At time T05, the voltage applied to the bit line BL is increased from the voltage VSS to the voltage VBL2, and the voltage applied to the source line is changed from the voltage VSS to a voltage VCELSRC2. The voltage VBL2 is, for example, a voltage that enables a read current to flow through the bit line BL when the selected memory cell transistor MCT connected to the bit line BL is in the ON state. The voltage VCELSRC2 is a reference voltage different from the voltage VSS. The voltage VCELSRC2 may match the voltage VCELSRC1.

After the potential of the wiring to which the voltage is applied is stabilized in this manner, the sense amplifier circuit SA connected to the bit line BL senses, for example, the current on the bit line BL. Accordingly, as a result of the program operation, for example, it is checked whether the threshold voltage of the selected memory cell transistor MCT connected to the bit line BL has reached the target voltage.

Subsequently, at time T06, each of the voltages applied to the bit line BL, the source line SL, the selected select gate line SGD(sel), the select gate line SGS, the selected word line WL(sel), the non-selected word line WL(usel), and the group-selection word GWL is changed to the voltage VSS.

In this manner, the verification operation following the program operation is executed. During the write operation, such a combination of the program operation and the verification operation may be repeated. FIG. 13 also illustrates the time change of the voltages applied to the wirings in the final verification operation. The details are as follows.

At time T07, the control described below is performed.

Each of the voltages is applied to the selected select gate line SGD(sel) and the select gate line SGS is increased from the voltage VSS to the voltage VSG. The voltage applied to the selected word line WL(sel) is changed from the voltage VSS to the voltage VCGRV. Each of the voltages applied to the non-selected word line WL(usel) and the group-selection word line GWL is increased from the voltage VSS to the voltage VREAD. The voltage VCGRV may be different from the voltage VCGRV used at time 104 among the voltages VCGRV described above.

After the potential of the wiring to which the voltage is applied is stabilized in this manner, the control described below is performed.

At time T08, the voltage applied to the bit line BL is increased from the voltage VSS to the voltage VBL2, and the voltage applied to the source line is changed from the voltage VSS to the voltage VCELSRC2.

After the potential of the wiring to which the voltage is applied is stabilized in this manner, the sense amplifier circuit SA connected to the bit line BL senses, for example, the current on the bit line BL. Accordingly, as a result of the program operation, for example, it is checked whether the threshold voltage of the selected memory cell transistor MCT connected to the bit line BL has reached the target voltage.

Subsequently, at time T09, each of the voltages applied to the bit line BL, the source line SL, the selected select gate line SGD(sel), the select gate line SGS, the selected word line WL(sel), the non-selected word line WL(usel), and the group-selection word line GWL is changed to the voltage VSS.

Heretofore, the write operation executed by the semiconductor storage device 1 according to the first embodiment is described above. As described with reference to FIG. 7, a similar write operation may be used to allow the threshold voltage of each group-selection transistor GCT to be classified as a type "0" or type "1". When the threshold voltage of the group-selection transistor GCT is increased, the voltage applied to the group-selection word line GWL connected to the gate of the group-selection transistor GCT is controlled as described above for the selected word line WL(sel). The control of the voltage applied to each of the other wirings is the same as the write operation described above.

(2) Read Operation

The semiconductor storage device 1 according to the first embodiment can execute the read operation for the block BLK(sel) of the plane PB illustrated in FIG. 2 as a target in units of the bit line group BLG. More specifically, the semiconductor storage device 1 can select, for example, one bit line group BLG among the plurality of bit line groups BLG and can read the data stored in the memory cell transistor MCT connected to the bit line group BLG in the block BLK(sel). Hereinafter, the selected bit line group BLG is denoted by the reference numeral BLK(sel).

(2-1) Command Sequence

Figure 14:
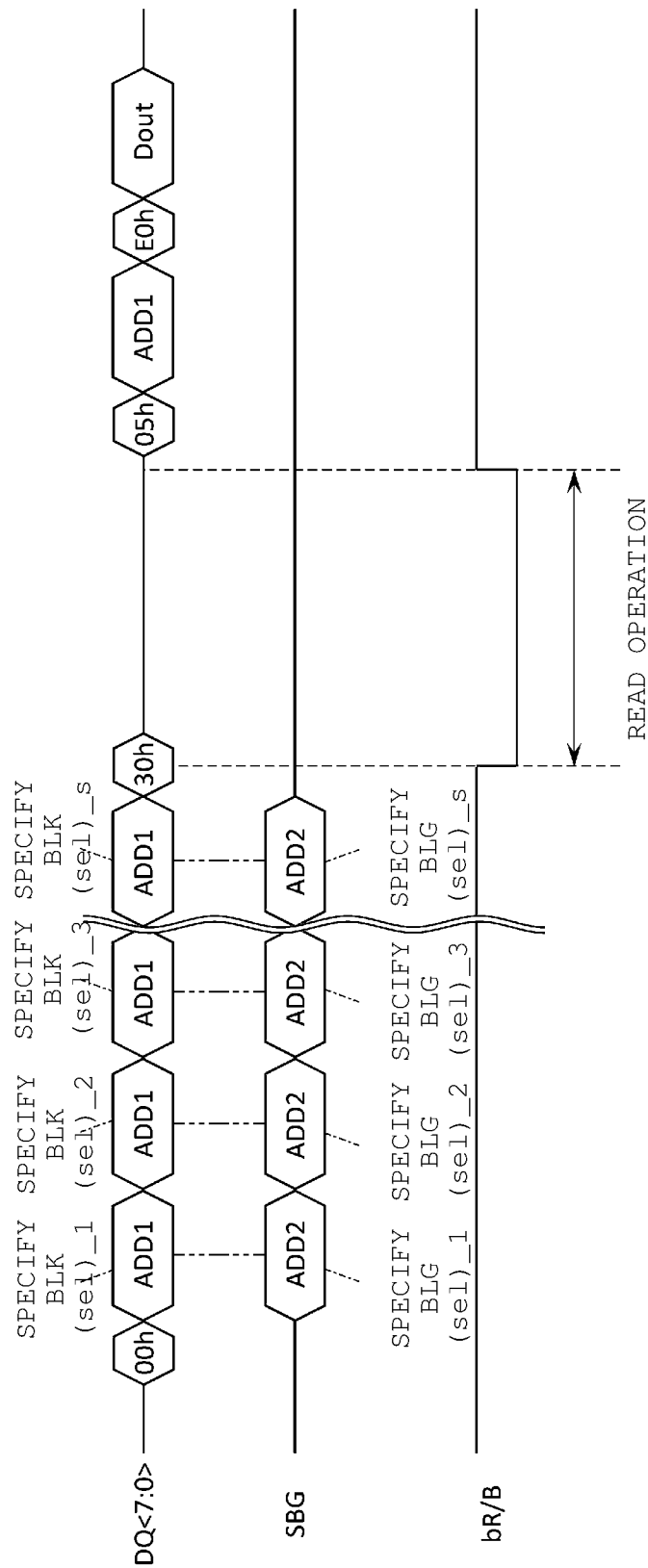
FIG. 14 is a diagram illustrating an example of a timing chart illustrating time changes of a command set and various other signals related to a certain read operation executed by the semiconductor storage device according to the first embodiment.

FIG. 14 illustrates an example of a timing chart illustrating the command set and time changes of various other signals related to a certain read operation executed by the semiconductor storage device 1 according to the first embodiment. In the following, for facilitating the reference, the read data DAT described so far will be referred to as read data Dout. In the following description, when "level" is used in connection with a signal, unless otherwise specified, the level is referred to as the voltage level of the signal. In the following description, when a certain signal is described as being at a certain level, unless the control that subsequently changes the signal to another level is explicitly described, it is assumed that the signal is maintained at the described level.

The semiconductor storage device 1 transmits the ready/busy signal bR/B at the H level to the memory controller 2 while the semiconductor storage device 1 is in the ready state. On the other hand, the semiconductor storage device 1 transmits the ready/busy signal bR/B at the L level to the memory controller 2 while the semiconductor storage device 1 is in the busy state.

For example, while the semiconductor storage device 1 transmits the ready/busy signal bR/B at the H level to the memory controller 2, that is, while the semiconductor storage device 1 is in the ready state, the memory controller 2 operates as follows.

The memory controller 2 generates the command set for causing the semiconductor storage device 1 to execute the read operation and transmits the command set to the semiconductor storage device 1 via the signals DQ<7:0>. The command set includes a command "00$h$", the address information ADD1, and a command "30$h$". The memory controller 2 further generates the address information ADD2 and transmits the address information ADD2 to the semiconductor storage device 1 via the signal SBG. The semiconductor storage device 1 receives the command set and the address information ADD2 and starts the read operation. The details are as follows.

The memory controller 2 generates the command "00h" and transmits the command "00h" to the semiconductor storage device 1. The command "00h" is a command used to cause the semiconductor storage device 1 to execute the read operation. The logic control circuit 15 enables the input/output circuit 13 to receive the command "00h" and transfer the command "00h" to the command register 143.

Subsequently, the memory controller 2 generates, for example, the address information ADD1 spanning 5 cycles and transmits the address information ADD1 to the semiconductor storage device 1. The address information ADD1 includes, for example, the column address and the row address. The row address includes the block address and the plane address. The block address specifies the block BLK(sel)_1 as a read target. The plane address specifies a plane PB as a target. The column address specifies, for example, a plurality of latch circuits XDL as a starting point of the read operation. The address information ADD1 is not limited to information spanning 5 cycles, and may span any applicable number of cycles. A case where the plane PB specified by the plane address is the plane PB illustrated in FIG. 2 will be described. In the plane PB, the bit line group BLG is defined as described with reference to FIG. 7. The row address also includes a page address that specifies the word line WL(sel) and a string address that specifies the string unit SU(sel). The logic control circuit 15 enables the input/output circuit 13 to receive the address information ADD1 and transfer the address information ADD1 to the address register 142.

The memory controller 2 generates the address information ADD2 and transmits the address information ADD2 to the semiconductor storage device 1 via the signal SBG. The address information ADD2 is related to the address information ADD1. The address information ADD2 specifies, for example, a certain bit line group BLG(sel)_1. For example, the logic control circuit 15 enables the input/output circuit 13 to receive the address information ADD2 and transfer the address information ADD2 to the address register 142. The control by the logic control circuit 15 may, for example, be based on some timing control signal transmitted from the memory controller 2 and received by the logic control circuit 15. The timing control signal may be synchronized with, for example, the write enable signal bWE. In FIG. 14, it is illustrated that the address information ADD1 and the address information ADD2 associated with the address information ADD1 are transmitted by the memory controller 2 in substantially the same period of time, but the period of time during which the address information ADD2 is transmitted is not limited thereto. In this specification, the address information ADD2 is described as being transmitted via one signal SBG, but the address information ADD2 may be transmitted via a plurality of signals. The address information ADD2 may span any applicable number of cycles.

The memory controller 2 may perform generation and transmission of such a combination of the address information ADD1 and the address information ADD2 a plurality of times. FIG. 14 illustrates a case where the generation and transmission of the address information ADD1 are performed s times and the generation and transmission of the address information ADD2 are also performed s times. The above command set includes s times of the address information ADD1. Hereinafter, the case where each of the generation and transmission of the address information ADD1 and the address information ADD2 is performed s times will be described, but each of the generation and transmission of the address information ADD1 and the address information ADD2 may be performed only once. In FIG. 14, the address information ADD1 is illustrated for each time, but it may be assumed that the address information combining first address information ADD1, second address information ADD1, . . . , and s-th address information ADD1 is transmitted. The same is applied to the address information ADD2.

The block address of the second address information ADD1 specifies another block BLK(sel)_2 as a read target. The block address of the third address information ADD1 specifies still another block BLK(sel)_3 as a read target. Hereinafter, the same is applied, and the block address of the s-th address information ADD1 specifies still another block BLK(sel)_s as a read target. As described above, at any cycle, the block address of the address information ADD1 of the cycle specifies a block BLK different from the block address of the address information ADD1 of the other cycle.

Furthermore, the plane address of the address information ADD1 of each cycle specifies, for example, a common plane PB with the plane address of the address information ADD1 of the other cycle. Hereinafter, the description will be made assuming that the common plane PB is specified. The page address of the address information ADD1 of each cycle may specify a word line WL common to the word line WL specified by the page address of the address information ADD1 of another cycle and may specify another word line WL. The string address of the address information ADD1 of each cycle may specify a string unit SU common to the string unit SU specified by another string address of the address information ADD1 of different cycle and may specify another string unit SU.

The second address information ADD2 specifies another bit line group BLG(sel)_2 different from that specified by the first address information ADD2. The third address information ADD2 specifies still another bit line group BLG(sel)_3. Hereinafter, the same is applied, and the s-th address information ADD2 specifies still another bit line group BLG(sel)_s. In this manner, for any cycle, the address information ADD2 of the cycle specifies another bit line group BLG different from that specified by the address information ADD2 of another cycle.

The address information ADD1 and ADD2 transmitted in this manner are received into the input/output circuit 13 and transferred to the address register 142 as described above.

Subsequently, the memory controller 2 generates the command "30h" and transmits the command "30h" to the semiconductor storage device 1. The command "30h" is a command used to cause the semiconductor storage device 1 to execute the read operation based on the address information ADD1 received after the receiving of the command "00h". The logic control circuit 15 enables the input/output circuit 13 to receive the command "00h" and transfer the command "00h" to the command register 143.

In response to receiving the command "30h", the sequencer 16 causes the logic control circuit 15 to transmit the ready/busy signal bR/B to the memory controller 2 at the L level. Accordingly, the memory controller 2 notifies that the semiconductor storage device 1 is in the busy state. In response to receiving the command "30h", the sequencer 16 controls the voltage generation circuit 18, the driver set 19, the sense amplifier module 11, the row decoder module 12, and the like to start the read operation.

During the read operation, the memory cell transistor MCT connected to the bit line BL of the bit line group BLG(sel) specified by the address information ADD2 associated with the address information ADD1 in the block BLK(sel) specified by the address information ADD1 each cycle may be a target of the read operation. The details are as follows.

The memory cell transistor MCT connected to the bit line BL of the bit line group BLG(sel)_1 in the block BLK(sel)_1 may be a target of the read operation. Furthermore, the memory cell transistor MCT connected to the bit line BL of the bit line group BLG(sel)_2 in the block BLK(sel)_2 may be a target of the read operation. Furthermore, the memory cell transistor MCT connected to the bit line BL of the bit line group BLG(sel)_3 in the block BLK(sel)_3 may be a target of the read operation. Hereinafter, the same is applied, and the memory cell transistor MCT connected to the bit line BL of the bit line group BLG(sel)_s in the block BLK(sel)_s may also be a target of the read operation.

The data Dout read by the read operation is transferred to the latch circuit XDL of the sense amplifier module 11. After that, the sequencer 16 causes the ready/busy control circuit 17 to transmit the ready/busy signal bR/B at the H level to the memory controller 2. Accordingly, the memory controller 2 notifies that the semiconductor storage device 1 is in the ready state.

In response to receiving the ready/busy signal bR/B indicating that the semiconductor storage device 1 is in the ready state, the memory controller 2 generates a command set including a command "05h", the address information ADD1, and a command "E0h" and transmits the command set to the semiconductor storage device 1 via the signals DQ<7:0>. The semiconductor storage device 1 receives the command set. The command "05h" and the command "E0h" are commands used to cause the semiconductor storage device 1 to output the read data transferred to the latch circuit XDL by the read operation to the memory controller 2. In response to receiving the command "E0h", the sequencer 16 causes the semiconductor storage device 1 to output the data Dout transferred to the latch circuit XDL by the read operation to the memory controller 2. It is noted that the command "05h", address information ADD1, and the command "E0h" described above do not have to be used. In this case, the semiconductor storage device 1 may output the data Dout to the memory controller 2 by using, for example, a toggle of the read enable signal bRE transmitted from the memory controller 2 as a trigger.

In the above description, it is described that the semiconductor storage device 1 receives the address information ADD2 that specifies the bit line group BLG from the memory controller 2 via the signal SBG. However, the embodiment is not limited thereto. The address information that specifies the bit line group BLG may be provided in the command set for causing the semiconductor storage device 1 to execute the read operation transmitted by the memory controller 2 via the signals DQ<7:0>. Further, a prefix command indicating that the memory controller 2 transmits the address information ADD2 to the semiconductor storage device 1 may be transmitted before the command set illustrated in FIG. 14.

FIG. 15 illustrates an example of a table used when the memory controller 2 generates the command set for causing the semiconductor storage device 1 to execute the read operation.

As illustrated in FIG. 15, the table illustrates logical address and physical address in association with each other and is used for address conversion between the logical address and the physical address. The table is also called a logical-to-physical address conversion table.

The memory controller 2 receives, for example, the host command from the host device 4. The host command includes the logical address or information associated with the logical address.

When the memory controller 2 receives the host command for executing the write operation, the memory controller 2 generates the address information to be provided in the command set for executing the write operation, for example, based on a certain physical address. The physical address specifies a certain plane PB, a certain block BLK, a certain string unit SU, a certain word line WL, and a plurality of latch circuits XDL at the starting point of the operation to be performed. The write operation as described above is executed by the semiconductor storage device 1 based on the address information in units of page via the bit lines BL0 to BL(m−1). The memory controller 2 writes the correspondence between the logical address related to the received host command and the physical address in, for example, the logical-to-physical address conversion table stored in the RAM 23. In this manner, the logical-to-physical address conversion table used in the read operation is generated.

When the memory controller 2 receives the host command for executing the read operation, the memory controller 2 refers to the logical-to-physical address conversion table and acquires the physical address associated with the logical address related to the received host command. The memory controller 2 generates the address information ADD1, for example, based on the physical address. The address information ADD1 specifies, for example, the same plane PB, block BLK, string unit SU, word line WL, and the plurality of latch circuits XDL as those of which the physical address is specified. That is, the address information ADD1 specifies a target area for the read operation in units of a page. The memory controller 2 generates the command set for executing the read operation including the address information ADD1 based on the host command. The memory controller 2 may further generate the address information ADD2 based on the host command without referring to as the logical-to-physical address conversion table. The address information ADD2 specifies, for example, a certain bit line group BLG as a unit of the read operation.

(2-2) Parallel Reading from Plurality of Blocks

Figure 16:
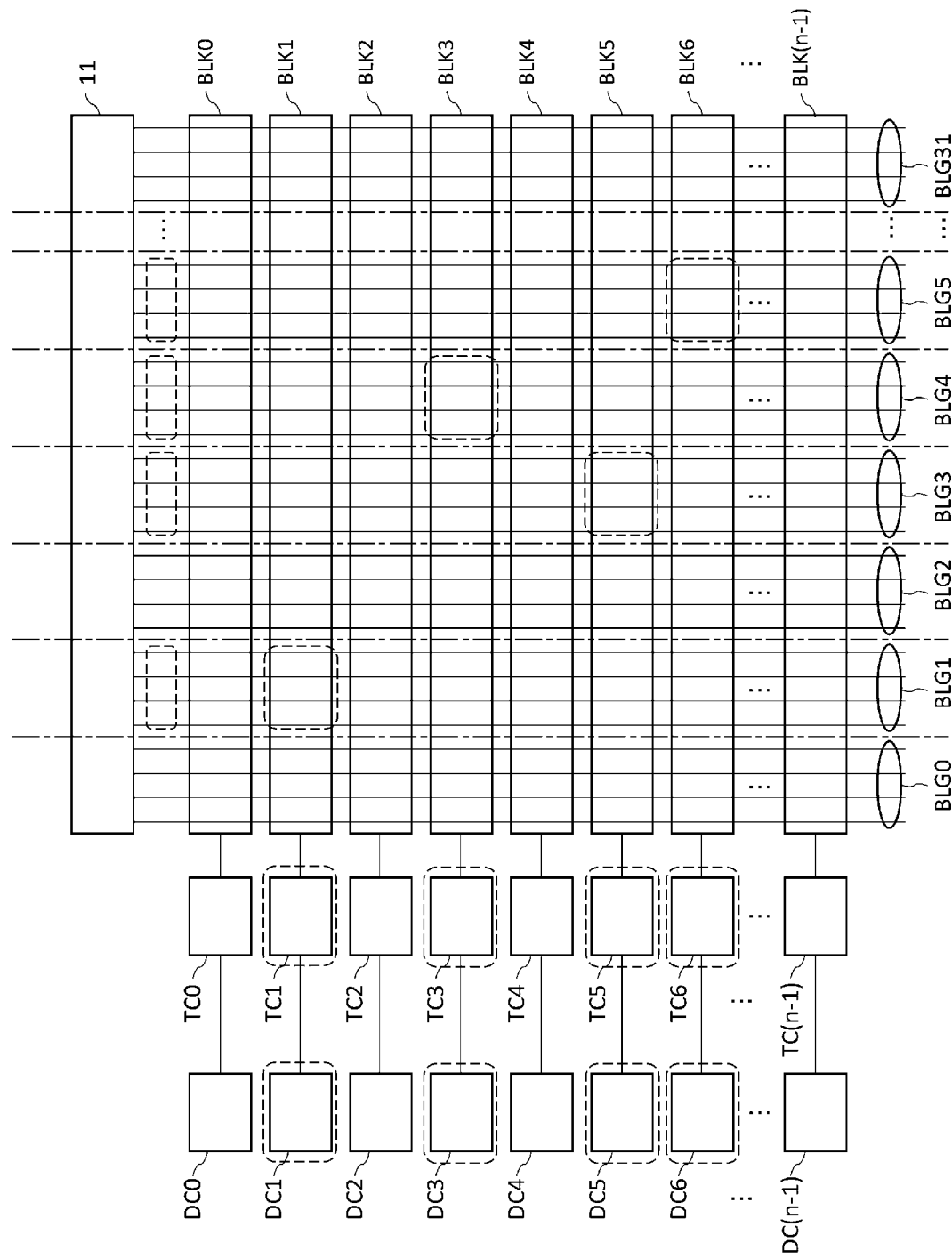
FIG. 16 is a diagram conceptually illustrating reading of data from a plurality of blocks executed by the semiconductor storage device according to the first embodiment.

FIG. 16 is a diagram for conceptually illustrating the reading of data Dout from the plurality of blocks BLK(sel) described with reference to FIG. 14. In FIG. 16, the number of bit lines BL configuring each bit line group BLG is 4 for the purpose of facilitating reference.

FIG. 16 illustrates an example of a case where the block BLK(sel)_1 and the bit line group BLG(sel)_1 in the example of FIG. 14 are the block BLK1 and the bit line group BLG1, respectively. The block BLK(sel)_2 and the bit line group BLG(sel)_2 in the example of FIG. 14 are the block BLK3 and a bit line group BLG4, respectively. The block BLK(sel)_3 and the bit line group BLG(sel)_3 in the example of FIG. 14 are the block BLK5 and the bit line group BLG3, respectively. The block BLK(sel)_s and the bit line group BLG(sel)_s in the example of FIG. 14 are the block BLK 6 and a bit line group BLG5, respectively.

The driver circuit DC and the voltage transfer circuit TC associated with the block BLK specified by the block address of the address information ADD1 each cycle operate as follows. The driver circuit DC supplies various voltages to the voltage transfer circuit TC based on, for example, the page address and string address in the address information ADD1 and the address information ADD2 associated with the address information ADD1. The voltage transfer circuit TC transfers various supplied voltages to the block BLK based on the block address. In the example of FIG. 16, the driver circuit DC1 and the voltage transfer circuit TC1, the driver circuit DC3 and the voltage transfer circuit TC3, the driver circuit DC5 and the voltage transfer circuit TC5, and the driver circuit DC6 and the voltage transfer circuit TC6 operate in this manner. For example, the sense amplifier module 11 activates, the sense amplifier unit SAU associated with the bit line BL of the bit line group BLG(sel) specified by the address information ADD2 each cycle. The sense amplifier module 11 uses the activated sense amplifier unit SAU to read data from each block BLK(sel) as follows.

Data is read from the block BLK1 via the bit line BL of the bit line group BLG1, data is read from the block BLK3 via the bit line BL of the bit line group BLG4, data is read from the block BLK5 via the bit line BL of the bit line group BLG3, . . . , and data is read from the block BLK6 via the bit line BL of the bit line group BLG5.

In this manner, since data is read from different blocks BLK(sel) via the bit lines of different bit line groups BLG(sel), the sense amplifier module 11 can read the data from these blocks BLK(sel) in parallel.

The sense amplifier module 11 transfers the data read by the activated sense amplifier unit SAU to the input/output circuit 13 via the data bus and outputs the data to the memory controller 2 via the input/output circuit 13. The size of the data is, for example, proportional to the number of activated sense amplifier units SAU. That is, the size of the data is proportional to the number of bit lines configuring the bit line group BLK(sel).

(2-3) Timing Chart

In the above description, it is described that, during the read operation, the data may be read in parallel from each of the plurality of blocks BLK(sel) in units of the bit line group BLG. Hereinafter, the description will be focused on the reading of data in units of a certain bit line group BLG(sel) from a certain block BLK(sel) among such blocks BLK(sel).

Figure 17:
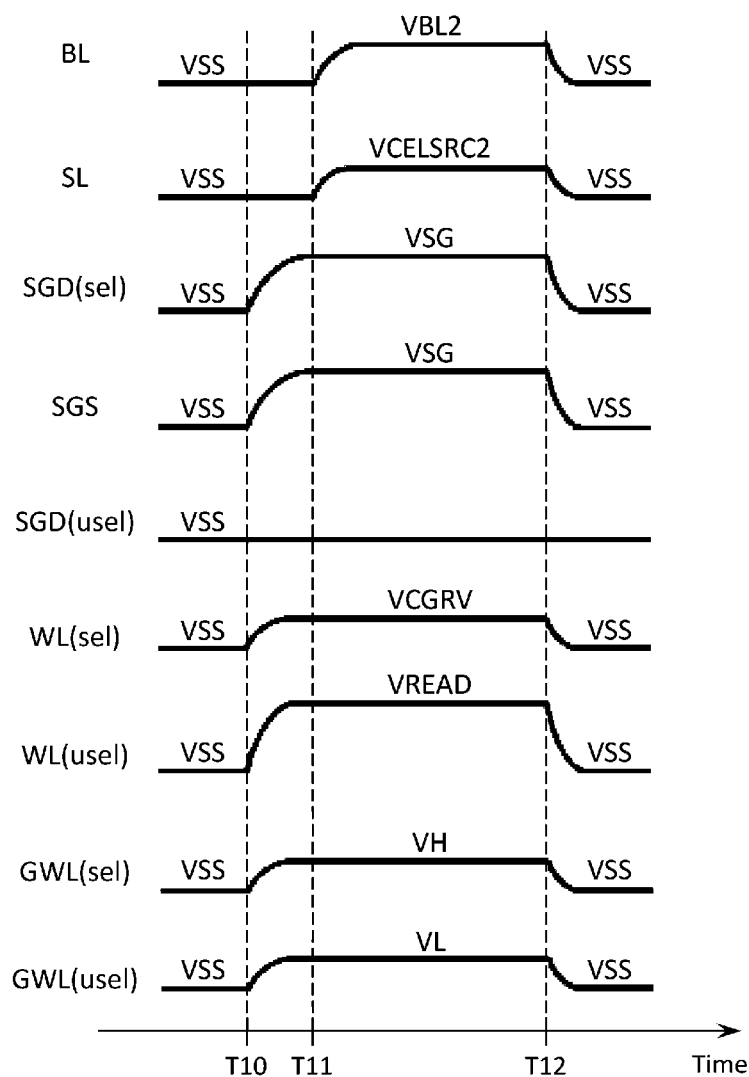
FIG. 17 is a diagram illustrating an example of a timing chart illustrating time changes of voltages applied to various wirings related to a certain selected block when the semiconductor storage device according to the first embodiment executes the read operation.

FIG. 17 illustrates an example of a timing chart illustrating time changes of voltages applied to various wirings related to the selected block BLK(sel) when the semiconductor storage device 1 according to the first embodiment executes the read operation. The read operation described below is only an example, and the read operation according to the embodiment is not limited thereto.

In the following description, the group-selection word line GWL related to the selected block BLK(sel) will be referred to as follows.

As described with reference to FIG. 7, for each of the bit lines BL configuring the bit line group BLG(sel), one group-selection transistor GCT having a threshold voltage classified as a type "1" is connected to the bit line BL. The group-selection word line GWL connected to the group-selection transistor GCT having a threshold voltage classified as a type "1" is referred as a group-selection word line GWL(sel), and the other group-selection word lines GWL are referred as group-selection word lines GWL(usel). The group-selection word line GWL(sel) is a group-selection word line GWL associated with the bit line group BLG(sel) as described with reference to FIG. 8.

Hereinafter, for the same reason as the example of FIG. 13, for the non-selected word line WL(usel), the control of the voltage applied to a certain one non-selected word line WL(usel) will also be described. For the non-selected select gate line SGD(usel), the control of the voltage applied to a certain one non-selected select gate line SGD(usel) will also be described. For the group-selection word line GWL(usel), the control of the voltage applied to a certain one group-selection word line GWL (usel) will also be described. For the bit line BL, the control of the voltage applied to a certain one bit line BL will also be described.

Before the start of the read operation of the example of FIG. 17, the voltage VSS is applied to each of the word lines WL(sel), WL(usel), GWL(sel), and GWL(usel), the select gate lines SGD(sel), SGD(usel), and SGS, the bit line BL, and the source line SL.

At the time T10, the control described below is performed.

The voltage applied to the select gate lines SGD(sel) and SGS is increased from the voltage VSS to voltage VSG, respectively. The voltage applied to the selected word line WL(sel) is changed from the voltage VSS to the voltage VCGRV. The voltage applied to the non-selected word line WL(usel) is increased from the voltage VSS to the voltage VREAD.

The voltage applied to the group-selection word line GWL(sel) is changed from the voltage VSS to the voltage VH. The voltage applied to the group-selection word line GWL(usel) is changed from the voltage VSS to the voltage VL. In the example of FIG. 17, the voltage VL is higher than the voltage VSS.

Subsequently, at time T11, the voltage applied to the bit line BL is increased from the voltage VSS to the voltage VBL2, and the voltage applied to the source line SL is changed from the voltage VSS to the voltage VCELSRC2.

After the potential of the wiring to which the voltage is applied is stabilized in this manner, for each of the bit lines BL of the bit line group BLG(sel), the sense amplifier circuit SA connected to the bit line BL senses, for example, the current flowing through the bit line BL. This sensing can be performed because each group-selection transistor GCT connected to the bit line BL is in the ON state. The sense amplifier circuit SA reads the data stored in the selected memory cell transistor MCT connected to the bit line BL based on the sense of the current.

Subsequently, at time T12, each of the voltages applied to the bit line BL, the source line SL, the selected select gate line SGD(sel), the select gate line SGS, the selected word line WL(sel), the non-selected word line WL(usel), and the group-selection word line GWL(sel), and the group-selection word line GWL(usel) is changed to the voltage VSS.

Figure 18:
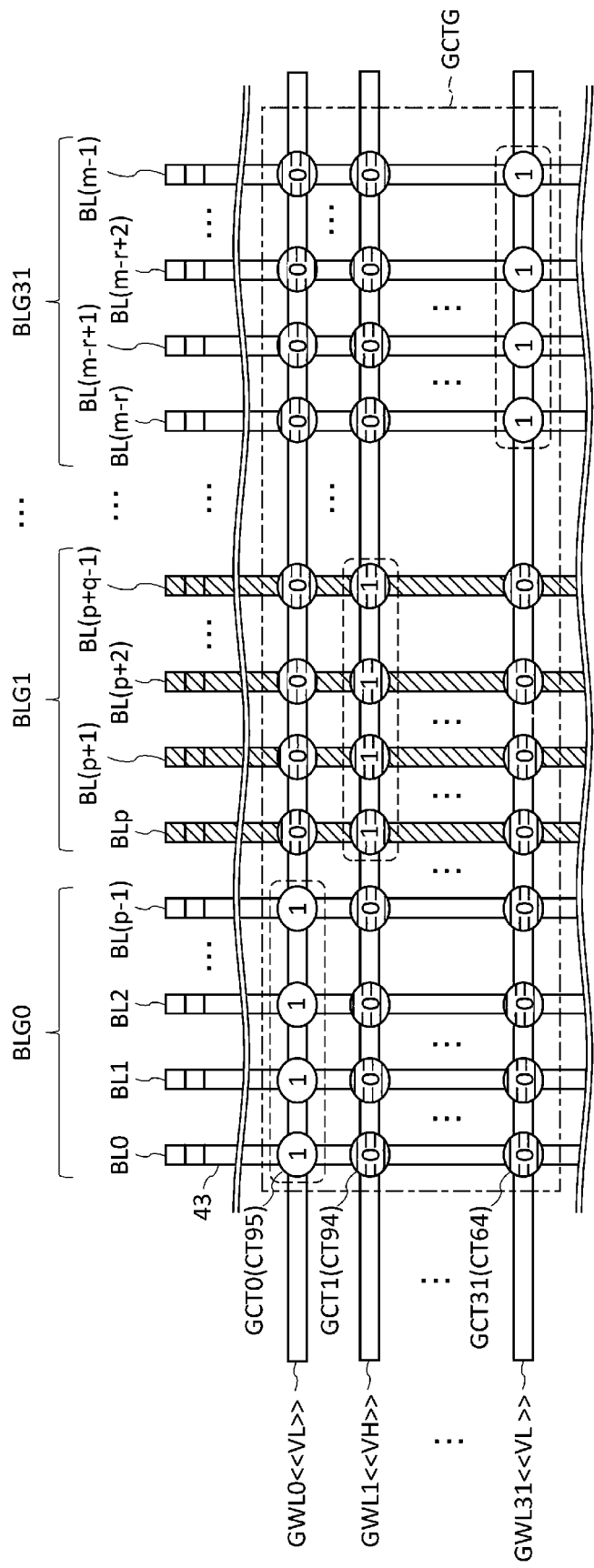
FIG. 18 is a diagram illustrating applying of a voltage to each of group-selection word lines when the semiconductor storage device according to the first embodiment performs reading data from a certain block in units of a certain bit line group.

FIG. 18 is a diagram illustrating application of a voltage to each of the group-selection word lines GWL related to the block BLK(sel) when the reading of data from the block BLK(sel) is executed in units of the bit line group BLG1. In the example of FIG. 18, the threshold voltage of each group-selection transistor GCT is set as illustrated in FIG. 7.

For each of the bit lines BL configuring the bit line group BLG1, among the threshold voltages of the group-selection transistors GCT connected to the bit line BL, only the threshold voltage of the transistor GCT1 is classified as a type "1", and the threshold voltages of the other transistors GCT are classified as a type "0". Therefore, the group-selection word line GWL1 connected to the transistor GCT1 is the group-selection word line GWL(sel), and the other group-selection word lines GWL are the group-selection word line GWL(usel). Therefore, from the time T11 to the time T12 in the example of FIG. 17, the voltage VH is applied to the group-selection word line GWL1, and the voltage VL is applied to the other group-selection word lines GWL. The application of such a voltage to the various wirings is controlled, for example, based on the address information ADD2 that specifies the bit line group BLG1.

Hereinafter, the description will be focused on a certain bit line BL of the bit line group BLG1, but the following description also applies to the other bit lines BL of the bit line group BLG1.

When voltages are applied to the group-selection word lines GWL as described above, the voltages are applied to the gates of the group-selection transistors GCT connected to the bit lines BL as follows. The voltage VH higher than the threshold voltage is applied to the gate of the transistor GCT1 having a threshold voltage classified as a type "1" via the group-selection word line GWL1. The voltage VL higher than these threshold voltages is applied to the gates of other transistors GCT having a threshold voltage classified as a type "0" via the other group-selection word lines GWL, respectively.

Accordingly, all the group-selection transistors GCT connected to the bit line BL are in the ON state. As a result, the sense amplifier circuit SA connected to the bit line BL can read the data stored in the selected memory cell transistor MCT, for example, by sensing the current flowing through the bit line BL.

On the other hand, the other bit line groups BLG are as follows. Hereinafter, a certain bit line BL of the bit line group BLG0 will be described as an example. The same description applies to other bit lines BL of the bit line group BLG other than the bit line group BLG1.

When a voltage is applied to each of the group-selection word lines GWL as described above, the voltage VL is applied to the gate of the group-selection transistor GCT0 connected to the bit line BL via the group-selection word line GWL0. The threshold voltage of the group-selection transistor GCT0 is classified as a type "1", and the threshold voltage is higher than the voltage VL.

Accordingly, the group-selection transistor GCT0 is in the OFF state. As a result, even when the memory cell transistor MCT connected to the bit line BL and the selected word line WL(sel) is in the ON state, the ON state of the memory cell transistor MCT does not affect the current flowing through the bit line BL or the like.

In this manner, it is possible to read data from the block BLK(sel) in units of the bit line group BLG1. The reading of the data does not affect the current flowing through the bit lines BL of another bit line groups BLG or the like. This denotes that the semiconductor storage device 1 can read data also from another block BLK in units of bit line group BLG.

Therefore, as described with reference to FIGS. 14 and 16, the semiconductor storage device 1 can read data from the plurality of blocks BLK in parallel via different bit line groups BLG.

In the above description, an example in which the data is read in parallel from the plurality of blocks BLK(sel) of the same plane PB is described. However, as already described above, the data may be read from only one block BLK(sel) via one bit line group BLG.

In the above description, an example in which the data is read from one block BLK(sel) via one bit line group BLG is described. However, the data may be read from one block BLK(sel) via two or more or any number of bit line groups BLG.

For example, in the example of FIG. 18, a case where the data is read from a certain block BLK(sel) in units of bit line groups BLG0 and BLG1 will be described. The address information ADD2 associated with the address information ADD1 specifying the block BLK(sel) described with reference to FIG. 14 specifies, for example, the bit line groups BLG0 and BLG1.

For each of the bit lines BL configuring the bit line group BLG0, among the threshold voltages of the group-selection transistors GCT connected to the bit line BL, only the threshold voltage of the transistor GCT0 is classified as a type "1". The group-selection word line GWL0 connected to these transistors GCT0 is referred to as a group-selection word line GWL(sel). Furthermore, for each of the bit lines BL configuring the bit line group BLG1, among the threshold voltages of the group-selection transistors GCT connected to the bit line BL, only the threshold voltage of the transistor GCT1 is classified as a type "1". The group-selection word line GWL1 connected to these transistors GCT1 is also referred to as a group-selection word line GWL(sel). The remaining group-selection word line GWL is set as the group-selection word line GWL(usel).

Similarly to the example of FIG. 18, the voltage VH is applied to the group-selection word lines GWL0 and GWL1 which are the group-selection word lines GWL(sel). On the other hand, the voltage VL is applied to the other group-selection word lines GWL. Accordingly, data can be read from the block BLK(sel) via the bit line groups BLG0 and BLG1. From another block BLK(sel) from which the data can be read in parallel, it is possible to read the data in units of one or more bit line groups BLG that do not include any of the bit line groups BLG0 and BLG1.

[Effect]

Each of the bit lines BL0 to BL(m−1) related to the memory cell array 10 of the semiconductor storage device 1 according to the first embodiment is included in one of the plurality of bit line groups BLG.

In the examples of FIGS. 7 and 8, for each of the bit lines BL configuring a certain bit line group BLG, the threshold voltage of the group-selection transistor GCT connected to the bit line BL is as follows. The threshold voltage of the group-selection transistor GCT connected to the group-selection word line GWL is classified as a type "1". The threshold voltage of the group-selection transistor GCT connected to each of the other group-selection word lines GWL is classified as a type "0". This applies to any bit line group BLG, but if the bit line group BLG is different, the group-selection word line GWL is different.

The semiconductor storage device 1 can select, for example, one bit line group BLG from such a bit line group BLG in the read operation targeting a certain block BLK(sel) and can read the data stored in the selected memory cell transistor MCT connected to the bit line group BLG(sel). The details are as follows.

In the example of FIG. 17, from time T11 to time T12, the semiconductor storage device 1 applies a voltage to the group-selection word line GWL related to the block BLK (sel) as follows. The semiconductor storage device 1 applies the voltage VH to the group-selection word line GWL(sel) and applies the voltage VL to the other group-selection word lines GWL(usel).

For each of the bit lines BL configuring the bit line group BLG(sel), the group-selection transistor GCT connected to the bit line BL is connected to one of the group-selection word lines GWL as follows. The group-selection transistor GCT of the threshold voltage classified as a type "1" is connected to the group-selection word line GWL(sel). Each of the group-selection transistors GCT having a threshold voltage classified as a type "0" is connected to one of the group-selection word lines GWL(usel).

When a voltage is applied to the group-selection word line GWL as described above, a voltage is applied to the gate of each group-selection transistor GCT connected to the bit line BL as follows. The voltage VH higher than the threshold voltage is applied to the gate of the transistor GCT having a threshold voltage classified as a type "1" via the group-selection word line GWL(sel). The voltage VL higher than these threshold voltages is applied to the gates of other transistors GCT having a threshold voltage classified as a type "0" via other group-selection word lines GWL(usel). Accordingly, all the group-selection transistors GCT connected to the bit line BL are in the ON state. As a result, the sense amplifier circuit SA connected to the bit line BL can read data stored in the selected memory cell transistor MCT by, for example, sensing the current flowing through the bit line BL.

On the other hand, each bit line BL of the other bit line group BLG is as follows.

As described above, when a voltage is applied to each of the group-selection word lines GWL, the voltage VL lower than the threshold voltage is applied to the gate of the group-selection transistor GCT having a threshold voltage classified as a type "1" connected to the bit line BL via the group-selection word line GWL(usel). Accordingly, the group-selection transistor GCT is in the OFF state. As a result, even when the memory cell transistor MCT connected to the bit line BL and the selected word line WL(sel) is in the ON state, the ON state of the memory cell transistor MCT does not affect the current flowing through the bit line BL or the like.

In this manner, the semiconductor storage device 1 can execute the read operation for the block BLK(sel) as a target in units of the bit line group BLG. As described with reference to FIG. 9, among the word lines WL related to the block BLK(sel), many bit line groups BLG as the number of word lines WL used as the group-selection word lines GWL may be configured. When more bit line groups BLG are configured, each bit line group BLG may be configured with a smaller number of bit line groups BL. When each bit line group BLG is configured with a smaller number of bit lines BL, the read operation is executed in units of a smaller number of bit lines BL, and data having a smaller size is read by the read operation.

Therefore, according to the semiconductor storage device 1 according to the first embodiment, when the size of the desired data is small, the reading of the data in units of a size of the desired data can be performed without reading extra data. This enables data access, for example, in units of several tens of bytes, which is required by a graph database or the like. For example, when the reading of data including extra data is performed, the extra data is also transferred between the semiconductor storage device and the memory controller, delay in transferring the desired data occurs, and partial occupancy of the memory interface between the semiconductor storage device and the memory controller occurs. According to the semiconductor storage device 1 according to the first embodiment, since the reading of the data in units of a size of the desired data can be performed, such a delay in transferring the desired data does not occur, and partial occupancy of the memory interface does not occur. Such the reading of the data is enabled by simple control that the voltage VH is applied to only one of the group-selection word lines GWL related to the block BLK (sel) as a read target, and the voltage VL is applied to the other group-selection word lines GWL.

As described above, the reading of the data from a certain block BLK(sel) in units of a certain bit line group BLG(sel) does not affect the current flowing through the bit line BL of another bit line group BLG or the like. This denotes that the semiconductor storage device 1 may read data also from another block BLK in units of bit line group BLG. Therefore, as described with reference to FIGS. 14 and 16, the semiconductor storage device 1 can read data from the plurality of blocks BLK in parallel via different bit line groups BLG.

Therefore, according to the semiconductor storage device 1 according to the first embodiment, an access speed of a random read may be improved, and efficiency of data transfer may be improved. Accordingly, for the purpose of improving the data transfer efficiency of the data stored in the database, it is not necessary for the semiconductor storage device to read the data once, sort the data, and after that, rewrite the data in the database. Such rewriting leads to deterioration of characteristics of the semiconductor storage device and deterioration of access performance. Therefore, according to the semiconductor storage device 1, the deterioration of characteristics and the deterioration of access performance can be prevented.

Furthermore, when the semiconductor storage device 1 receives a command for executing the write operation in the TLC mode, the semiconductor storage device 1 can execute the write operation by utilizing the control for the QLC mode as described with reference to FIG. 6. The portion where each of the threshold voltage distributions formed as a result overlaps the adjacent threshold voltage distribution on the graph is smaller than that in the case where the control in the QLC mode is not utilized. Accordingly, the bit error rate when the semiconductor storage device 1 executes the read operation is reduced.

For example, when the semiconductor storage device executes the read operation in units of a smaller number of bit lines BL while maintaining a ratio of the error correction code in the data DAT, the frequency at which the error correction process by the ECC circuit fails can also be increased as the number of execution of the read operation. Therefore, the frequency at which the semiconductor storage device performs retry read may also be increased. However, according to the semiconductor storage device 1 according to the first embodiment, the bit error rate is reduced as described above, and thus, the frequency of failure of the error correction process is reduced. For this reason, according to the semiconductor storage device 1, even when the semiconductor storage device 1 executes the read operation in units of a smaller number of bit lines BL while maintaining the ratio of the error correction code in the data DAT, it is possible not to increase the frequency of the retry read.

Further, the memory controller 2 according to the first embodiment will be described. The memory controller 2 generates the command set for executing the read operation in the semiconductor storage device 1 and transmits the command set to the semiconductor storage device 1. The semiconductor storage device 1 executes the read operation based on the command set. The memory controller 2 generates the address information ADD1 to be provided in the command set by referring to the logical-to-physical address conversion table as illustrated in FIG. 15, for example, based on the host command received from the host device 4. The address information ADD1 specifies, for example, a plane PB, a block BLK, a string unit SU, a word line WL, and a plurality of latch circuits XDL. That is, the address information ADD1 specifies the target area of the read operation in units of a page similarly to the case of the write operation. On the other hand, the memory controller 2 generates the address information ADD2 based on the host command without referring to the logical-to-physical address conversion table. The address information ADD2 specifies, for example, a certain bit line group BLG as a target unit of the read operation. The semiconductor storage device 1 executes the read operation in units of the bit line group BLG based on the address information ADD2.

In this manner, the memory controller 2 generates the address information ADD2 that specifies a certain bit line group BLG as a target unit of the read operation without referring to the logical-to-physical address conversion table. For example, when the information indicating the bit line group BLG is also obtained from the logical-to-physical address conversion table in this manner, the capacity of the logical-to-physical address conversion table becomes large, and therefore, the time required for the memory controller to generate the address information used for the read operation becomes long. However, according to the memory controller 2 according to the first embodiment, as described above, the information indicating the bit line group BLG is generated without being based on the logical-to-physical address conversion table. Accordingly, it is possible to prevent the capacity of the logical-to-physical address conversion table from becoming significantly large, and the time required for the memory controller 2 to generate the address information used for the read operation does not become excessively long.

MODIFIED EXAMPLE (1) Modified Example 1

The configurations of the driver set 19 and the row decoder module 12 are not limited to those described with reference to FIGS. 11 and 12. Other examples will be described below. In the following, the portions different from those described with reference to FIGS. 11 and 12 will be mainly described.

Figure 19:
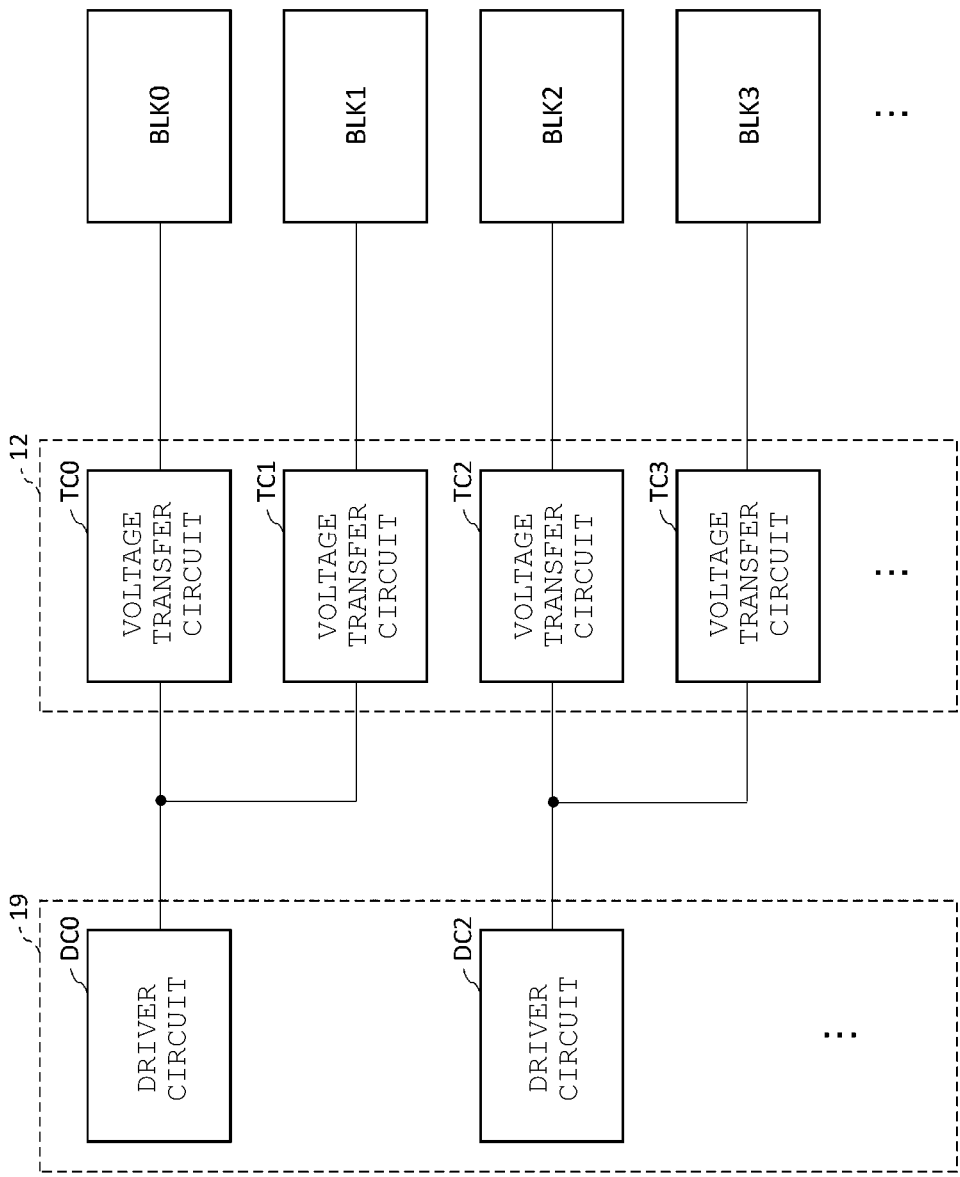
FIG. 19 is a diagram illustrating an example of a configuration of a driver set and a row decoder module of a semiconductor storage device according to Modified Example 1 of the first embodiment.

FIG. 19 illustrates an example of the configurations of the driver set 19 and the row decoder module 12 of the semiconductor storage device 1 according to Modified Example 1 of the first embodiment.

The driver set 19 includes driver circuits DC0 and DC2. The driver circuit DC0 is connected to the voltage transfer circuits TC0 and TC1. The driver circuit DC2 is connected to the voltage transfer circuits TC2 and TC3.

Figure 20:
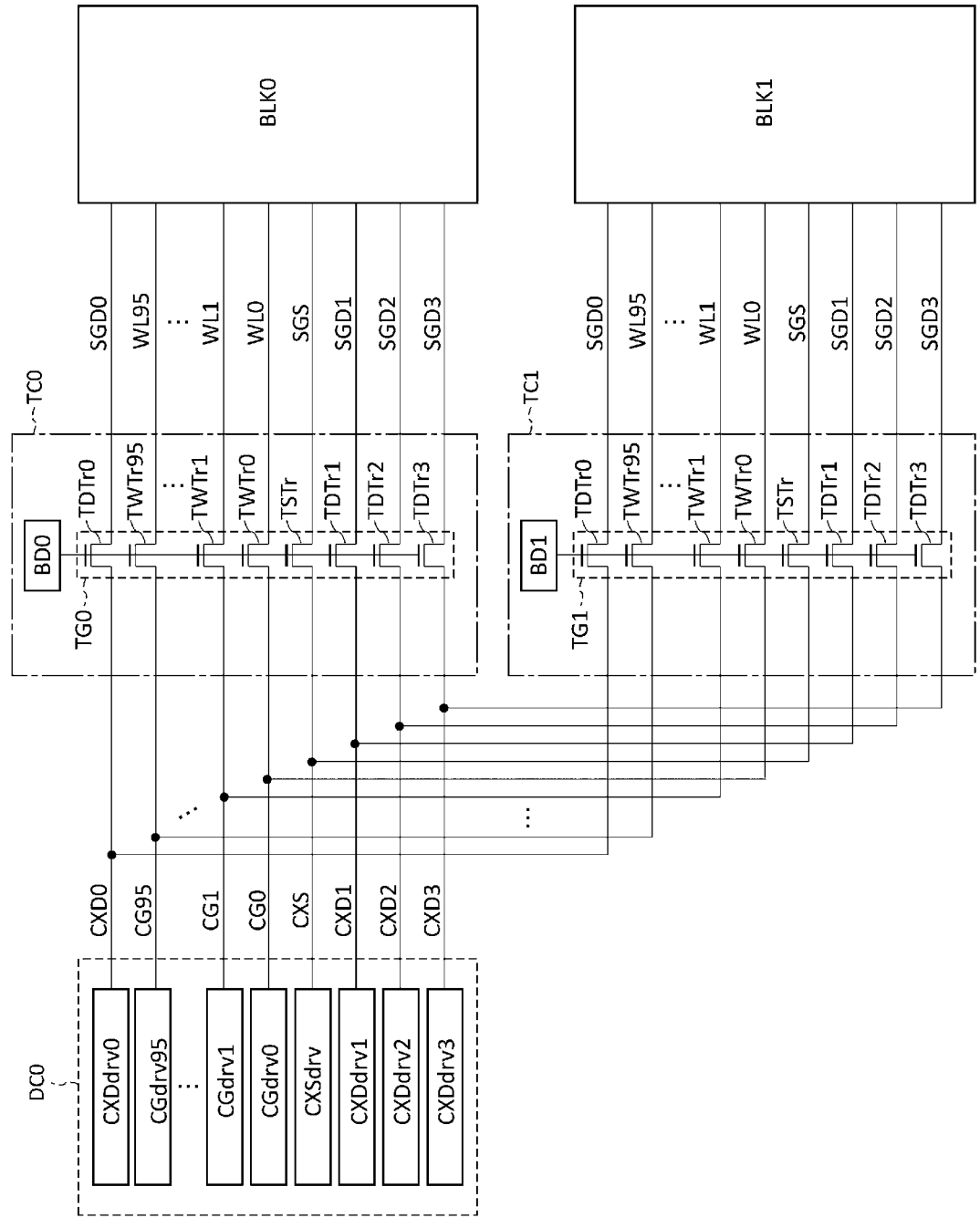
FIG. 20 is a diagram illustrating an example of a configuration of a certain driver circuit and two voltage transfer circuits of the semiconductor storage device according to Modified Example 1 of the first embodiment.

FIG. 20 illustrates an example of the configurations of the driver circuit DC0 and the voltage transfer circuits TC0 and TC1 of the semiconductor storage device 1 according to Modified Example 1 of the first embodiment. Hereinafter, the driver circuit DC0 and the voltage transfer circuits TC0 and TC1 will be described, and for example, the same description applies to the driver circuit DC2 and the voltage transfer circuits TC2 and TC3.

The driver circuit DC0 and the voltage transfer circuit TC0 are connected via wirings CG0 to CG95, CXD0 to CXD3, and CXS, as described with reference to FIG. 12. The voltage transfer circuit TC0 and the block BLK0 are connected via the word lines WL0 to WL95 and the select gate lines SGD0 to SGD3 and SGS, as described with reference to FIG. 12.

The voltage transfer circuit TC1 has the same configuration as the voltage transfer circuit TC0, as described with reference to FIG. 12. The details are as follows. The voltage transfer circuit TC1 includes a block decoder BD1 and a transistor group TG1. The transistor group TG1 includes transistors TWTr0, TWTr1, . . . , TWTr95, TDTr0, TDTr1, TDTr2, TDTr3, and TSTr. The output end of the block decoder BD1 is connected to each of the gates of the transistors TWTr0, TWTr1, . . . , TWTr95, TDTr0, TDTr1, TDTr2, TDTr3, and TSTr of the transistor group TG1. Hereinafter, the connection relationship between the driver circuit DC0 and the voltage transfer circuit TC1 will be described with a focus on each transistor provided in the transistor group TG1. The voltage transfer circuit TC1 is connected to various wirings connected to the driver circuit DC0 as follows. It is noted that the connection relationship between the voltage transfer circuit TC1 and the block BLK1 is the same as that described for the connection between the voltage transfer circuit TC0 and the block BLK0 with reference to FIG. 12.

The first end of the transistor TWTr0 is connected to the wiring CG0. The first end of the transistor TWTr1 is connected to the wiring CG1. Hereinafter, the same applies, and the first end of the transistor TWTr95 is connected to the wiring CG95. The first end of the transistor TDTr0 is connected to the wiring CXD0. The first end of the transistor TDTr1 is connected to the wiring CXD1. Hereinafter, the same applies, and the first end of the transistor TDTr3 is connected to the wiring CXD3. The first end of the transistor TSTr is connected to the wiring CXS.

When the block address of the address information ADD1 specifies one of the blocks BLK0 and BLK1, the driver circuit DC0 transfers a certain voltage among the voltages supplied to the driver set 19 to each of the wirings CG0 to CG95, CXD0 to CXD3, and CXS connected to the driver circuit DC based on, for example, the page address, the string address, and the like in the address information ADD1. The driver circuit DC0 may perform the transferring based on the address information ADD2 during the read operation.

Each of the voltage transfer circuits TC0 and TC1 enables the wirings CG0 to CG95, CXD0 to CXD3, and CXS to be electrically connected to the word lines WL0 to WL95 connected to the voltage transfer circuit TC and the wirings associated with the select gate lines SGD0 to SGD3 and SGS, respectively. The electrical connection is based on the result of the decoding of the block address by the block decoder BD provided in the voltage transfer circuits TC0 and TC1, as described with reference to FIG. 12. With such an electrical connection, each of the voltages transferred to the wirings CG0 to CG95, CXD0 to CXD3, and CXS by the driver circuit DC0 is transferred to one of the blocks BLK0 and BLK1.

Also in the examples of FIGS. 19 and 20, the semiconductor storage device 1 can execute the read operation for each block BLK as a target in units of the bit line group BLG. In the examples of FIGS. 19 and 20, as described with reference to FIG. 16, the semiconductor storage device 1 can read data from any blocks BLK of the blocks BLK0 and BLK1 and any blocks BLK of the blocks BLK2 and BLK3 in parallel. In the examples of FIGS. 19 and 20, the plurality of blocks BLK from which data is not read in parallel are connected to the same driver circuit DC via the voltage transfer circuit TC, respectively. According to the semiconductor storage device 1 according to Modified Example 1 of the first embodiment, the circuit scale can be reduced by reducing the number of driver circuits DC in this manner.

(2) MODIFIED EXAMPLE 2

In the above description, the case where the semiconductor storage device 1 can execute the read operation for any block BLK of the plane PB illustrated in FIG. 2 as a target in units of the bit line group BLG is described. Hereinafter, the case where the semiconductor storage device 1 does not execute the read operation for a certain block BLK of the plane PB in units of the bit line group BLG will be described.

Figure 21:
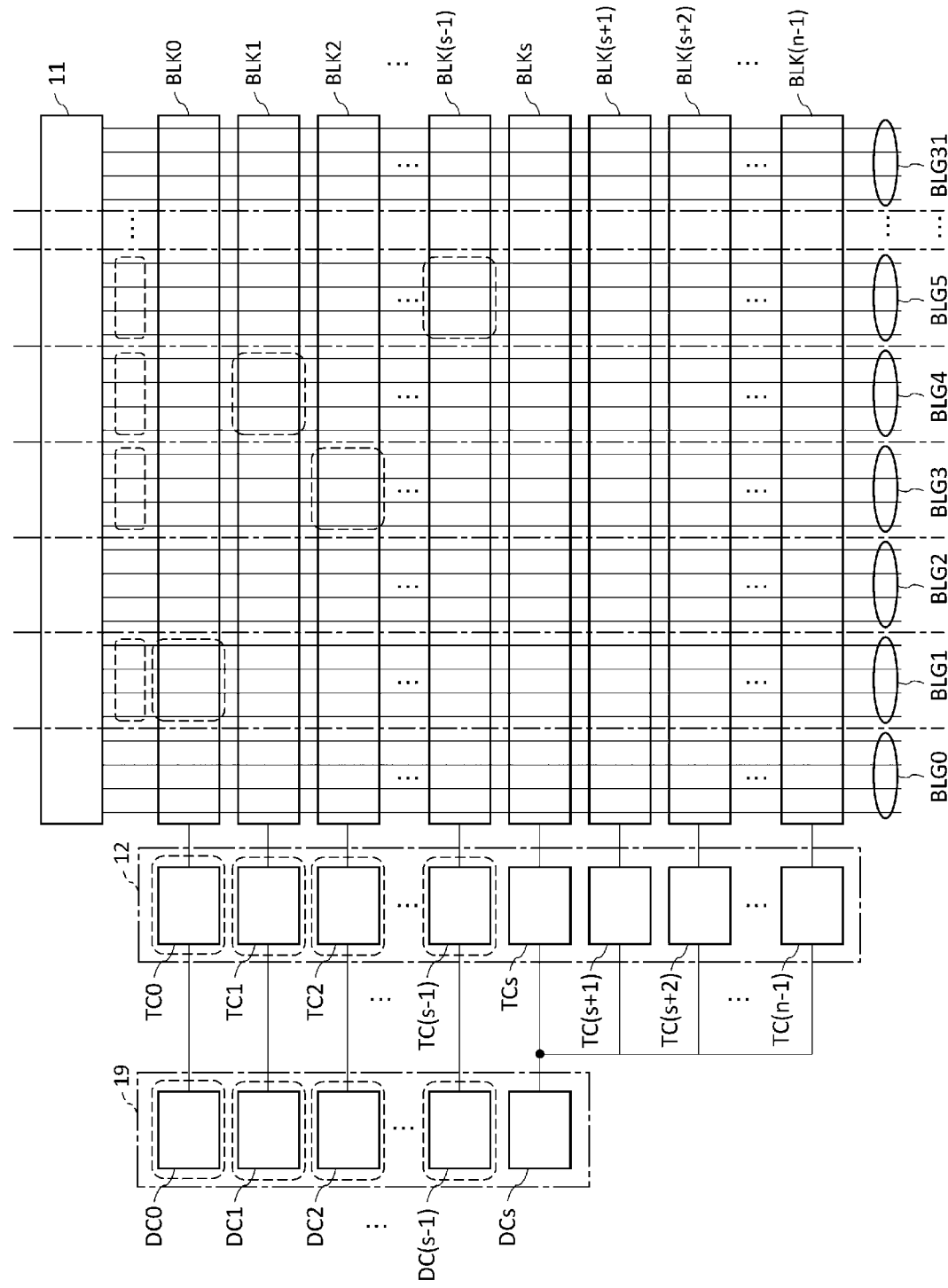
FIG. 21 is a diagram illustrating an example of a configuration of a driver set and a row decoder module of a semiconductor storage device according to Modified Example 2 of the first embodiment.

FIG. 21 illustrates an example of a configuration related to the driver set 19 and the row decoder module 12 of the semiconductor storage device 1 according to Modified Example 2 of the first embodiment.

The driver set 19 includes driver circuits DC0, DC1, DC2, . . . , and DCs (s is an integer greater than or equal to 1 and smaller than n). The row decoder module 12 includes voltage transfer circuits TC0, TC1, TC2, . . . , and TC(n−1) similarly to the example of FIG. 11. The voltage transfer circuits TC0, TC1, TC2, . . . , and TC(n−1) are associated with the blocks BLK0, BLK1, BLK2, . . . , and BLK(n−1) on a one-to-one basis in the order of appearance, respectively.

Hereinafter, the portions different from those described with reference to FIGS. 11 and 12 will be mainly described.

The driver circuits DCs are connected to the voltage transfer circuits TCs, TC(s+1), TC(s+2), . . . , and TC(n−1) similarly to the description with reference to FIGS. 19 and 20. Each voltage transfer circuit TC is connected to the block BLK associated with the voltage transfer circuit TC similarly to the description with reference to FIG. 11.

For each block BLK of the blocks BLK0, BLK1, BLK2, . . . , and BLK(s−1), the description made with reference to FIG. 7 is satisfied.

The following description applies to each block BLK of the blocks BLK, BLK(s+1), BLK(s+2), . . . , and BLK(n−1). None of the word lines WL related to the block BLK are used as the group-selection word lines GWL described with reference to FIG. 7, and none of the cell transistors CT of the block BLK are used as the group-selection transistors GCT.

Also in the example of FIG. 21, for each of the blocks BLK0 to BLK(s−1), the semiconductor storage device 1 can execute the read operation on the blocks BLK as a target in units of the bit line group BLG, and furthermore, the semiconductor storage device 1 can read the data in parallel from the plurality of blocks BLK among these blocks BLK. FIG. 21 illustrates a behavior that data is read in parallel from a plurality of blocks BLK among these blocks BLK, similarly to the example of FIG. 16.

In the example of FIG. 21, for each of the blocks BLK to BLK(n−1), the read operation for the blocks BLK as a target is executed in units of a page via the bit lines BL0 to BL(m−1). During the read operation, for example, the sense amplifier unit SAU associated with each of the bit lines BL0 to BL(m−1) is activated.

It is noted that for the blocks BLK0 to BLK(s−1) that are the targets of the read operation in units of the bit line group BLG, as described in Modified Example 1, each of the plurality of blocks BLK from which data is not read in parallel may be connected to the same driver circuit DC via the voltage transfer circuit TC.

Second Embodiment

Hereinafter, a semiconductor storage device 1a according to a second embodiment will be described.

The reference numeral 1a is used to distinguish itself from the semiconductor storage device 1 according to the first embodiment, but the configuration of the semiconductor storage device 1a is the same as that of the semiconductor storage device 1 according to the first embodiment except for the aspects described below.

Similarly to the semiconductor storage device 1 according to the first embodiment, the semiconductor storage device 1a can execute the read operation for a certain block BLK of the plane PB illustrated in FIG. 2 as a target in units of the bit line group BLG. Hereinafter, when the semiconductor storage device 1a targets any block BLK of the plane PB similarly to the semiconductor storage device 1 according to the first embodiment, the case where the read operation can be executed in units of the bit line group BLG will be described. Hereinafter, one block BLK of the plane PB will be described as an example. The following description also applies to the other blocks BLK of the plane PB. Similarly to the example of FIG. 7, it is possible to execute the read operation in units of the bit line group BLG by setting the threshold voltage of each group-selection transistor GCT connected to the plurality of group-selection word lines GWL related to the block BLK.

FIG. 22 illustrates a table listing an example of setting of the threshold voltage of each group-selection transistor GCT in a certain string unit SU of the block BLK of the semiconductor storage device 1a according to the second embodiment. Hereinafter, the string unit SU will be described as an example, but the following description also applies to the other string units SU of the block BLK. Hereinafter, a case where 35 bit line groups BLG are configured with the bit lines BL0 to BL(m−1) will be described as an example, but the number of bit line groups BLG configured with the bit lines BL0 to BL(m−1) is not limited to 35.

Similarly to the example of FIG. 7, the group-selection word lines GWL0 to GWL6 are defined. Furthermore, similarly to the example of FIG. 7, for each of the bit lines BL0 to BL(m−1), among the cell transistors CT connected to the bit line BL, the group-selection transistors GCT0 to GCT6 are defined.

In the table, similarly to the table of FIG. 8, for each of the bit line groups BLG, illustrated is the setting of the threshold voltage of each group-selection transistor GCT related to the bit line BL configuring the bit line group BLG.

For each of the bit lines BL configuring the bit line group BLG0, the following conditions are satisfied for the group-selection transistors GCT related to the bit line group BL. That is, among the threshold voltages of the group-selection transistors GCT connected to the bit line BL, each of the threshold voltages of the transistors GCT0, GCT1, and GCT2 is classified as a type "1", and each of the threshold voltages of the other transistors GCT3 to GCT6 is classified as a type "0".

Similarly, for each of the bit lines BL configuring the bit line group BLG1, among the threshold voltages of the group-selection transistors GCT connected to the bit line BL, the threshold voltages of the transistors GCT0, GCT1, and GCT3 are classified as a type "1". Furthermore, for each of the bit lines BL configuring the bit line group BLG2, among the threshold voltages of the group-selection transistors GCT connected to the bit line BL, the threshold voltages of the transistors GCT0, GCT1, and GCT4 are classified as a type "1". Furthermore, for each of the bit lines BL configuring the bit line group BLG3, among the threshold voltages of the group-selection transistors GCT connected to the bit line BL, the threshold voltages of the transistors GCT0, GCT1, and GCT5 are classified as a type "1". Furthermore, for each of the bit lines BL configuring the bit line group BLG4, among the threshold voltages of the group-selection transistors GCT connected to the bit line BL, the threshold voltages of the transistors GCT0, GCT1, and GCT6 are classified as a type "1". Hereinafter, the same is applied as illustrated in the table of FIG. 22.

As described above, for each of the bit lines BL0 to BL(m−1), among the cell transistors CT connected to the bit line BL, seven cell transistors CT are described to function as the group-selection transistors GCT. Each of the remaining cell transistors CT connected to the bit line BL functions as a memory cell transistor MCT.

Subsequently, among the word lines WL related to a certain block BLK, how many bit line groups BLG may be by the bit lines BL0 to BL(m−1) according to the number of word lines WL used as the group-selection word line GWL is described.

In the example of FIG. 22, for each of the bit lines BL configuring a certain bit line group BLG, among the threshold voltages of the group-selection transistor GCT connected to the bit line BL, each of the threshold voltage of the group-selection transistor GCT connected to each of the three group-selection word lines GW is classified as a type "1", and each of the threshold voltages of the other transistors GCT is classified as a type "0". This applies to any bit line group BLG, but the combination of the three group-selection word lines GWL is different when the bit line group BLG is different. As described above, in the example of FIG. 22, the bit line group BLG was associated with a combination of the three group-selection word lines GWL on a one-to-one basis. In the example of FIG. 22, many bit line groups BLG as the number that may be associated with each other are configured. That is, many bit line groups BLG as the number of selection methods for selecting a combination of three lines among the seven group-selection word lines GWL are configured.

As described above, when 2t (t is an integer of 1 or more) word lines WL among the word lines WL related to a certain block BLK is used as the group-selection word lines GWL, the following may be considered as the number of bit line groups BLG that may be configured with the bit lines BL0 to BL(m−1). In the following description, the total number of selection methods for selecting i combinations among h different from each other is denoted by hCi. i is an integer of 1 or more, and h is an integer of i or more.

$_{2t}C_1$ is the number of selection methods for selecting one among the 2t group-selection word lines GWL, $_{2t}C_2$ is the number of selection methods for selecting a combination of two among the 2t group-selection word lines GWL, $_{2t}C_3$ is the number of selection methods for selecting a combination of three among the 2t group-selection word lines GWL, and $_{2t}C_4$, $_{2t}C_5$, $_{2t}C_6$, $_{2t}C_7$, . . . are similarly defined.

The maximum number of the numbers is $_{2t}C_t$. That is, when 2t word lines WL among the word lines WL related to a certain block BLK are used as the group-selection word lines GWL, the bit lines BL0 to BL(m−1) may configure the bit line groups BLG of which the maximum is $_{2t}C_t$.

Similarly, when (2t+1) word lines among the word lines WL related to a certain block BLK are used as the group-selection word lines GWL, the following may be considered as the number of bit line groups BLG that may be configured with the bit lines BL0 to BL(m−1).

$_{2t+1}C_1$ is the number of selection methods for selecting one among the (2t+1) group-selection word lines GWL, $_{2t+1}C_2$ is the number of selection methods for selecting a combination of two among the (2t+1) group-selection word lines GWL, $_{2t+1}C_3$ is the number of selection methods for selecting a combination of three among the (2t+1) group-selection word lines GWL, and $_{2t+1}C_4$, $_{2t+1}C_5$, $_{2t+1}C_6$, $_{2t+1}C_7$, . . . are similarly defined.

The maximum numbers are $_{2t+1}C_t$ and $_{2t+1}C_1$. That is, when (2t+1) word lines WL among the word lines WL related to a certain block BLK are used as the group-selection word lines GWL, the bit lines BL0 to BL(m−1) may configure the bit line groups BLG of which the maximums are $_{2t+1}C_t$ and $_{2t+1}C_t+1$.

FIG. 23 illustrates a table listing how many the bit line groups BLG may be configured with the bit lines BL0 to BL(m−1) according to the number of group-selection word lines GWL related to a certain block BLK of the memory cell array 10 of the semiconductor storage device 1a according to the second embodiment.

When the number of group-selection word lines GWL is 2t, many bit line groups BLG as the number of selection methods for selecting a combination of t group-selection word lines GWL among the 2t group-selection word lines GWL may be configured, and therefore, $_{2t}C_t$ bit line groups BLG may be configured.

When the number of group-selection word lines GWL is (2t+1), many bit line groups BLG as the number of selection methods for selecting a combination of t group-selection word lines GWL among the (2t+1) group-selection word lines GWL may be configured, and therefore, $_{2t+1}C_t$ bit line groups BLG may be configured.

In the table, it is illustrated that 35 bit line groups BLG may be configured when the number of group-selection word lines GWL is 7. This corresponds to the example of FIG. 22.

Next, the operation of the semiconductor storage device 1a is the same as the operation of the semiconductor storage device 1 according to the first embodiment except for the portions described below.

The reading of the data in units of the bit line group BLG from the block BLK described with reference to FIG. 22 is executed as described with reference to FIG. 17. In the semiconductor storage device 1a according to the second embodiment, the number of group-selection word lines GWL(sel) related to the block BLK(sel) is three. The combination of the three group-selection word lines GWL(sel) is a combination of the three group-selection word lines GWL associated with the bit line group BLG(sel) as described with reference to FIG. 22.

When the reading of the data from the block BLK(sel) is executed in units of the bit line group BLG1, the applying of a voltage to each of the group-selection word lines GWL related to the block BLK(sel) will be described.

The group-selection word lines GWL0, GWL1, and GWL3 are group-selection word lines GWL(sel). On the other hand, the other group-selection word lines GWL are the group-selection word lines GWL(usel). Therefore, from time T11 to time T12 in the example of FIG. 17, the voltage VH is applied to the group-selection word lines GWL0, GWL1, and GWL3, and the voltage VL is applied to the other group-selection word lines GWL.

Hereinafter, the description will be focused on a certain bit line BL of the bit line group BLG1, but the following description also applies to the other bit lines BL of the bit line group BLG1.

When voltages are applied to the group-selection word lines GWL as described above, the voltages are applied to the gates of the group-selection transistors GCT connected to the bit lines BL as follows. The voltage VH higher than the threshold voltage is applied to the gates of the transistors GCT0, GCT1, and GCT3 having a threshold voltage classified as a type "1" via the group-selection word lines GWL0, GWL1, and GWL3, respectively. The voltage VL higher than these threshold voltages is applied to the gates of other transistors GCT having a threshold voltage classified as a type "0" via the other group-selection word lines GWL, respectively.

Accordingly, all the group-selection transistors GCT connected to the bit line BL are in the ON state. As a result, the sense amplifier circuit SA connected to the bit line BL can read the data stored in the selected memory cell transistor MCT, for example, by sensing the current flowing through the bit line BL.

On the other hand, the other bit line groups BLG are as follows. Hereinafter, a certain bit line BL of the bit line group BLG0 will be described as an example. The same description applies to other bit lines BL of the bit line group BLG other than the bit line group BLG1.

When voltages are applied to the group-selection word lines GWL as described above, the voltage VL is applied to the gate of the group-selection transistor GCT2 connected to the bit line BL via the group-selection word line GWL2. The threshold voltage of the group-selection transistor GCT2 is classified as a type "1", and the threshold voltage is higher than the voltage VL.

Accordingly, the group-selection transistor GCT2 is in the OFF state. As a result, even when the memory cell transistor MCT connected to the bit line BL and the selected word line WL(sel) is in the ON state, the ON state of the memory cell transistor MCT does not affect the current flowing through the bit line BL or the like.

In this manner, the reading of the data from the block BLK(sel) in units of the bit line group BLG1 can be performed. The reading of the data does not affect the current flowing through the bit lines BL of another bit line group BLG or the like. This denotes that the semiconductor storage device 1a can read data also from another block BLK in units of bit line group BLG. Therefore, as described with reference to FIGS. 14 and 16, the semiconductor storage device 1a can read the data from the plurality of blocks BLK in parallel via different bit line groups BLG.

According to the semiconductor storage device 1a according to the second embodiment, as described for the semiconductor storage device 1 according to the first embodiment, for example, the reading of the data in units of a desired data size can be performed, and desired data movement efficiency can be improved. According to the semiconductor storage device 1a according to the second embodiment, the following effects can also be obtained.

In the semiconductor storage device 1 according to the first embodiment, as described with reference to FIG. 7, 32 bit line groups BLG are configured with the bit lines BL0 to BL(m−1), and among the word lines WL related to a certain block BLK, 32 word lines WL are used as the group-selection word lines GWL. In contrast, in the semiconductor storage device 1a according to the second embodiment, as described with reference to FIG. 22, 32 bit line groups BLG are configured with the bit lines BL0 to BL(m−1), and among the word lines WL related to a certain block BLK, seven word lines WL are used as group-selection word lines GWL. That is, in the semiconductor storage device 1a, the number of group-selection word lines GWL used is smaller than that in the example of FIG. 7, but a larger number of bit line groups BLG are formed.

Therefore, according to the semiconductor storage device 1a according to the second embodiment, as compared with the semiconductor storage device 1 according to the first embodiment, while the same number of bit line groups BLG is provided in a certain plane PB and while the data can be read in units of about the same size, the number of cell transistors CT used as the memory cell transistor MCT can be increased.

Other Embodiments

In this specification, the term "connection" refers to electrical connection, and thus, for example, intervention of another element between elements is not excluded.

In this specification, notations such as "same", "match", "constant", and "maintain" are used with the intention of including the case where there exists an error in the scope of design when the technique described in the embodiment is performed. The same applies to the case where the term "substantial" is redundantly used in combination with these notations similarly to the notation "substantially the same". Further, the notation of applying or supplying a certain voltage is intended to include both performing control for applying or supplying the voltage and actually applying or supplying the voltage. Furthermore, applying or supplying a certain voltage may include applying or supplying a voltage of, for example, 0 V.

While certain embodiments have been described, these embodiments have been presented by way of example only, and are not intended to limit the scope of the disclosure. The novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a memory cell array including a plurality of memory strings, a plurality of word lines, each of which is connected to the memory strings, and a plurality of bit lines connected to the memory strings, respectively, wherein the plurality of bit lines are grouped into a plurality of bit line groups; and
   a control circuit configured to:
   receive a read command and first address information specifying one or more of the bit line groups;
   in response to the read command, read data selectively from each memory string that is connected to each bit line in the one or more bit line groups specified by the first address information, and output the read data; and
   write data of a first bit size according to a mode of writing data of a second bit size that is greater than the first bit size.

2. The semiconductor storage device according to claim 1, wherein in response to the read command, the control circuit does not read data from any memory string connected to any bit line not included in the one or more bit line groups specified by the first address information.

3. The semiconductor storage device according to claim 1, wherein
   the control circuit is further configured to receive a second address information specifying one of the word lines, and
   the control circuit reads the data also based on the second address information.

4. The semiconductor storage device according to claim 1, wherein the control circuit includes a first terminal through which the read command is to be received and a second terminal through which the first address information is to be received.

5. The semiconductor storage device according to claim 4, wherein
   the second address information is also to be received through the first terminal, and
   the control circuit reads the data based on the second address information received through the first terminal and the first address information received through the second terminal.

6. The semiconductor storage device according to claim 1, wherein
the plurality of word lines include a first plurality of word lines for bit line group selection and a second plurality of word lines for memory cell access, and
the control circuit is configured to apply a select voltage to one or more word lines in the first plurality of word lines corresponding to the one or more bit line groups specified by the first address information.

7. The semiconductor storage device according to claim 6, wherein
the bit line groups include a first bit line group and a second bit line group, and
the first plurality of word lines includes a first word line for selection of the first bit line group, and a second word line for selection of the second bit line group.

8. The semiconductor storage device according to claim 7, wherein
each memory string connected to each bit line in the first bit line group includes a first transistor having a gate connected to the first word line and a second transistor having a gate connected to the second word line,
each memory string connected to each bit line in the second bit line group includes a third transistor having a gate connected to the first word line and a fourth transistor having a gate connected to the second word line,
a threshold voltage of the first transistor is greater than a threshold voltage of the second transistor, and
a threshold voltage of the fourth transistor is greater than a threshold voltage of the third transistor.

9. The semiconductor storage device according to claim 6, wherein a number of the first plurality of word lines is equal to a number of the bit line groups.

10. The semiconductor storage device according to claim 6, wherein a number of the first plurality of word lines is less than a number of the bit line groups.

11. A semiconductor storage device according to claim 1, wherein
the memory cell array includes a plurality of blocks, each of the blocks including a plurality of memory strings, a plurality of word lines, each of which is connected to the memory strings in the block, and a plurality of bit lines connected to the memory strings in the block, respectively, bit lines in the plurality of blocks being grouped into the plurality of bit line groups, and
a control circuit configured to:
receive with the read command, a third address information specifying one or more of the blocks; and
in response to the read command, read data selectively from each memory string that is included in the one or more of the blocks specified by the third address information and is connected to each bit line in the one or more bit line groups specified by the first address information, and output the read data.

12. The semiconductor storage device according to claim 11, wherein
word lines in the plurality of blocks are electrically separated from each other, and
the bit lines in the plurality of blocks are common to each other.

13. The semiconductor storage device according to claim 12, wherein
the plurality of blocks include a first block and a second block,
the plurality of bit line groups include a first bit line group and a second bit line group, and when the first and third address information specify a first bit line group of a first block and a second bit line group of a second block, the control circuit is configured to read first data from each memory string connected to the first bit line group of the first block and second data from each memory string connected to the second bit line group of the second block.

14. The semiconductor storage device according to claim 13, wherein a first period of time during which the first data is read at least partially overlaps with a second period of time during which the second data is read.

15. The semiconductor storage device according to claim 11, wherein
the plurality of blocks include a first block and a second block,
the control circuit includes a first driver circuit configured to output operation voltages to be supplied to the first block and a second driver circuit configured to output operation voltages to be supplied to the second block.

16. The semiconductor storage device according to claim 11, wherein
the plurality of blocks include a first block and a second block, and
the control circuit includes a driver circuit configured to output operation voltages, a first voltage transfer circuit configured to supply the operation voltages to the first block and a second voltage transfer circuit configured to supply the operation voltages to the second block.

17. A system comprising:
a semiconductor storage device chip including:
a memory cell array including a plurality of memory strings, a plurality of word lines, each of which is connected to the memory strings, and a plurality of bit lines connected to the memory strings, respectively, wherein the plurality of bit lines are grouped into a plurality of bit line groups; and
a control circuit; and
a controller chip configured to transmit a read command and a first address information specifying one or more of the bit line groups, wherein
the control circuit of the semiconductor storage device chip is configured to, in response to the read command, read data selectively from each memory string connected to each bit line in the one or more bit line groups specified by the first address information, output the read data to the controller chip, and write data of a first bit size according to a mode of writing data of a second bit size that is greater than the first bit size.

18. The system according to claim 17, wherein
the controller chip includes a first terminal and a second terminal, and
the controller chip is further configured to transmit the read command and a second address information specifying one or more of the plurality of word lines via the first terminal and transmit the first address information via the second terminal.

19. The system according to claim 18, wherein
the controller chip is connectable to a host, and
the controller chip is configured to:
store an address conversion table;
receive a command from the host;
generate the second address information based on the command received from the host, referring to the address conversion table; and generate the first address information based on the command received from the host, without referring to the address conversion table.

\* \* \* \* \*